US007194365B1

(12) United States Patent
Sonntag

(10) Patent No.: US 7,194,365 B1
(45) Date of Patent: Mar. 20, 2007

(54) METHOD AND APPARATUS FOR INTEGRATED UNDERSAMPLING

(75) Inventor: Jeffrey Lee Sonntag, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 10/930,292

(22) Filed: Aug. 31, 2004

(51) Int. Cl.
*G01R 13/00* (2006.01)

(52) U.S. Cl. .......................... 702/79; 702/72; 702/180; 702/189; 324/76.15

(58) Field of Classification Search ................ 702/66, 702/67, 69–74, 79, 124–126, 178, 180, 189, 702/190; 341/122, 123, 126; 324/76.15, 324/76.24, 76.38, 76.42, 76.52, 76.58, 76.77; 713/400, 500, 503, 600, 601
See application file for complete search history.

(56) References Cited

U.S. PATENT DOCUMENTS

| | | | |
|---|---|---|---|
| 6,191,718 B1 * | 2/2001 | Matsumoto | 341/143 |
| 6,532,441 B1 * | 3/2003 | Urso | 708/313 |
| 6,640,193 B2 * | 10/2003 | Kuyel | 702/69 |

OTHER PUBLICATIONS

Stewart, "Effect of sample clock jitter on IF-sampling IS-95 receivers", Sep. 1-4, 1997, The 8th IEEE International Symposium on Personal, Indoor and Mobile Radio Communications, 1997, vol. 2, pp. 366-370.*

Kiyono et al., "Jitter effect on digital downconversion receiver with undersampling scheme", Jul. 25-28, 2004, The 2004 47th Midwest Symposium on Circuits and Systems, 2004, IEEE, vol. 2, pp. II-677 to II-680.*

"Applications of On-Chip Samplers for Test and Measurement of Integrated Circuits." Ron Ho, Bharadwaj Amrutur, Ken Mai, Bennett Wilburn, Toshihiko Mori, and Mark Horowitz. Symposium on VLSI Circuits, 1998, Digest of Technical Papers. Publication date: June 11-13, 1998. On pp. 138-139.

* cited by examiner

*Primary Examiner*—Hal Wachsman
(74) *Attorney, Agent, or Firm*—Park, Vaughan & Feming, LLP

(57) ABSTRACT

An undersampling system can comprise an IC that has integrated, on the same physically contiguous IC, both an undersampler circuit and a receiver circuit whose input is to be monitored by undersampling. For a current phase of sample clocks relative to an input signal, the input signal is sampled until a sufficient number of samples are collected in a one dimensional histogram associated with the current phase. The phase of the sample clocks, relative to the input signal, can then be shifted. Such phase shift can be accomplished by a phase mixer. The phase shift can be small enough to provide sufficient resolution in a composite sampled image of the input signal. A mean value can be computed for each one dimensional histogram, resulting in a representation of the undersampled signal as a function of time that is suitable for further processing.

28 Claims, 17 Drawing Sheets

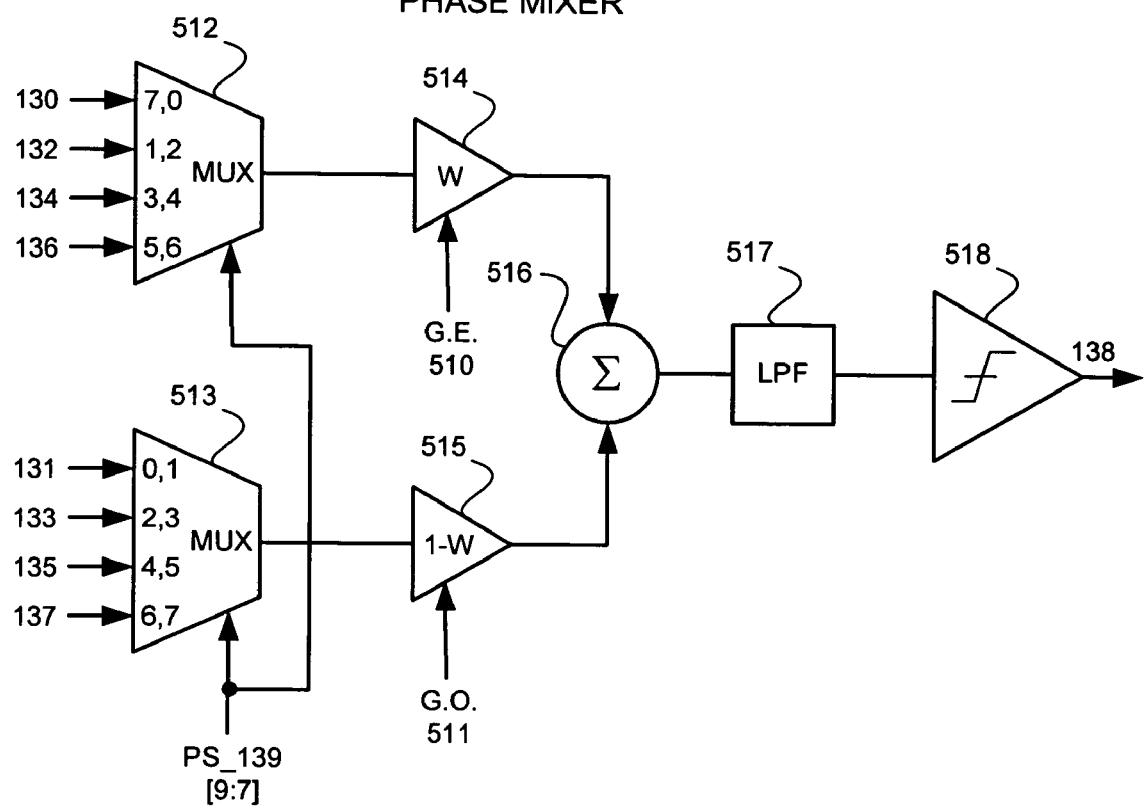
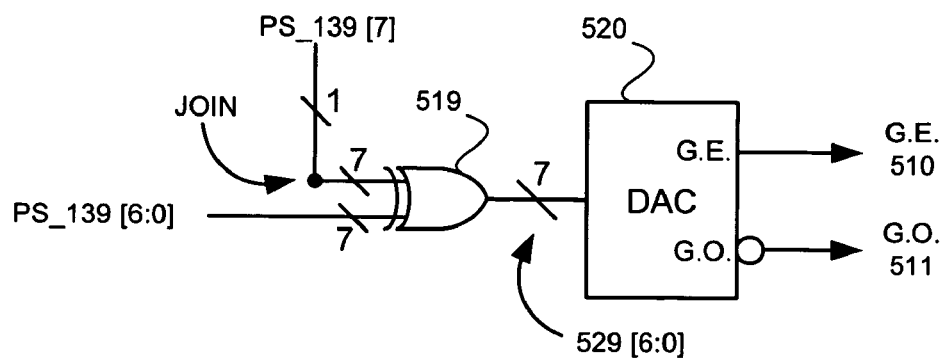
Figure 5A
PHASE MIXER

PHASE CIRCLE

FFT'S OF TRANSMITTED AND RECEIVED SIGNALS

RATIO OF FFT'S OF RECEIVED TO TRANSMITTED SIGNALS

METHOD AND APPARATUS FOR INTEGRATED UNDERSAMPLING

CROSS REFERENCE TO RELATED APPLICATION

This application is related to the following (currently pending) U.S. patent application that is herein incorporated by reference in its entirety:

Title: "Method and Apparatus For Integrated Channel Characterization;

Filing date: same as the present application;

Inventor: Jeffrey Lee Sonntag;

application Ser. No. 10/930,291.

FIELD OF THE INVENTION

The present invention relates to the collection of discrete time digital representations of analog signals, and more particularly to undersampling of such signals.

BACKGROUND OF THE INVENTION

During the design or maintenance of systems involving high-speed (e.g., 6.25 Giga-bit/sec) data transfer, it can be desirable to measure signals, as received by certain receiver circuits, as analog waveforms. Analog waveform measurement can be approximated by capturing a series of discrete time samples of a signal and converting the samples into digital values. Analog waveform measurement can be accomplished with digital sampling oscilloscopes (or DSO's).

DSO's, however, can pose several disadvantages. First, the physical packaging, of the system whose receiver circuits are to be monitored, can be very dense and not admit of the physical insertion of a DSO probe. Second, for high speed data transfer, the DSO probe itself can significantly change the characteristics of the channel and therefore the analog waveform to be measured.

It would therefore be desirable to provide an alternative to the DSO that can be connected in dense packaging environments and/or will not significantly change channel characteristics.

The frequency response of a channel (the manner in which a channel attenuates signals at each frequency) is also known as the $S_{21}$ measurement of the set of possible S-parameter measurements.

One approach to obtaining this information is a network analyzer. At each point in time, a network analyzer drives a sinusoidal signal of a particular frequency into an input port of the channel. At an output port of the channel, the network analyzer measures the amplitude attenuation and phase shift. Thus, in a time-serial fashion, frequency by frequency, the $S_{21}$ of the channel is constructed.

In addition to being a temporally serial approach to exploring a spectrum, a network analyzer relies on an ability to output a highly-accurate sinusoid at any frequency of interest, and on a receiver having the ability to very accurately measure the amplitude and phase of the sinusoid received.

It would therefore be desirable to capture $S_{21}$ measurements in a non-serial manner and with equipment that does not rely upon precision sinusoidal generation or reception.

SUMMARY OF THE INVENTION

Summary of Undersampling Overview

An advantage of undersampling, over full sampling, is that the sampling frequency can be arbitrarily low. To obtain this advantage, however, the input signal and sample clocks must be synchronous to a reference clock.

Because the input signal and sample clocks are synchronous to the same reference clock, the sample clocks have a certain offset phase, referred to herein as a "symbol offset phase," with respect to each symbol of the input signal.

A symbol stream can be either periodic or non-periodic, and it will still have a certain symbol offset phase. To have a pattern offset phase, however, in addition to having a symbol offset phase, a symbol stream needs to be periodic.

Sample clocks can have a pattern offset phase, with respect to the content of a periodic symbol stream, if the time period between sample clocks is an integer multiple of the pattern period.

Sample clocks that are spaced apart integer multiples of a pattern period can be referred to as performing "coherent" undersampling of a symbol stream. Coherent undersampling can be characterized by its ability to reconstruct a pattern, or a portion of a pattern, as a signal.

Sample clocks that sample a non-periodic symbol stream can be referred to as performing "incoherent" undersampling of the symbol stream.

For a given phase (symbol and, possibly, pattern) of sample clocks relative to an input signal, the input signal is sampled until a sufficient number of samples are collected. Such samples can be stored in a one dimensional histogram array associated with the current phase of the sample clocks relative to the input signal.

The phase of the sample clocks, relative to the input signal, can then be shifted. Such phase shift can be accomplished by a component referred to herein as a "phase mixer" (discussed further below). The phase shift can be small enough to provide sufficient resolution in a composite sampled image of the input signal.

For each phase increment, samples can be taken and stored in a one dimensional histogram associated with the current phase of the sample clock relative to the input signal. When a sufficiently temporally wide segment of the input signal is assembled, as a temporally-ordered array of one dimensional histograms, the undersampling process can be stopped.

The phase mixer can operate by shifting sample clocks, relative to the input signal, in accordance with an amount of phase shift indicated at a "PS" input to the phase mixer. The PS input to the phase mixer can be specified as an n-bit value, with a range from zero to $2^n-1$, corresponding to phase shifts from zero to two symbol intervals. The range of phase shift available with a phase mixer, resulting from varying its phase shift input from zero to $2^n-1$, can be measured in degrees as 360 degrees.

For coherent undersampling, where the desired output is a function suitable for further processing, from the temporally ordered array of one dimensional histograms, a mean value can be computed from each one dimensional histogram, resulting in a vector of mean values versus time.

Summary of Further Considerations for an Undersampling System

In general, the maximum temporal resolution of an undersampling system can depend on the amount of phase shift, measured in symbol intervals, per unit increment of the phase mixer's PS input.

If a visual representation is desired, for a two dimensional histogram, it can be desirable to increase the signal-level resolution such that visually smooth and continuous waveforms are presented. In an embodiment of an undersampling system, 512 levels of signal-level resolution, can be used.

For purposes of generating a visual representation, the number of samples per bin can be converted into an appropriate color with a color map.

To be able to distinguish, visually, among those bins containing relatively few samples, log-based color mapping can be used.

Summary of Undersampling Implementation

For an example undersampling system, a suitable Data Processing System 1600 can be any stored-program computer capable of receiving data values, as a result of undersampling, and producing a histogram thereof.

An undersampling system can further comprise an IC 1611 that has integrated, on the same physically contiguous IC, both an undersampler circuit and a receiver circuit whose input is to be monitored by undersampling. A connection 1615, that carries a differential signal to be undersampled, can couple a transmitter 1614 to the receiver on IC 1611.

In order to use undersampling, transmitter 1614 and the undersampler of IC 1611 must be synchronized to the same reference clock. A single reference clock generator 1616 can distribute, via a connection 1620, a reference clock to both transmitter 1614 and the undersampler of IC 1611.

FIG. 4A depicts an example apparatus for IC 1611.

The example receiver circuit, whose input is to be monitored by undersampling, is shown on IC 1611 as a receiver block 455. IC 1611 contains an internal controller 402 that interfaces with a control bus input, such as JTAG bus 1612, to produce or receive control signals for accomplishing the sampling. Also on IC 1611 are two instances, US 430 and US 431, of an undersampler of type 403.

A functional overview of an undersampler of type 403 follows. The node to be sampled is connected to input 438, while input 436 controls whether input 438 is "tracked" or "held." Tracking of input 438 occurs while input 436 is high. While tracking of input 438 occurs, on a sample capacitor of US 403, a signal level previously transferred to a hold capacitor in US 403 can be driven onto its output 424 by asserting output enable 426.

The undersamplers can be controlled by a trigger unit 432. Output 434 of trigger unit 432 produces the sample clocks referred to in the above "Summary of Undersampling Overview." Trigger unit 432 is an instance of a trigger unit of type 404. A functional overview of trigger unit type 404 follows.

In its steady state, trigger unit 404 outputs a high signal at 434 causing the undersamplers to track. Trigger unit 404 can change the level at 434 to low, causing the undersamplers to hold, when the following two events occur in sequence: i) trigger enable input 435 is asserted and ii) a sufficient number of clock edges occur at input 433. As part of determining a sufficient number of clock edges at input 433, trigger unit 404 can divide clock input 433 by N. The value of N can be set to accomplish coherent undersampling.

Clock input 433 of trigger unit 432 is clocked by an output of APLL 405 of FIG. 4A. APLL 405 can be an instance of type APLL 100 (APLL 100 is discussed below in "Summary of APLL 100"). The functionality of APLL 405 is comprised of two parts. First, to produce a clock 453 synchronized with reference clock 1620. Second, to provide a phase mixer, as described above, for shifting the phase relationship between clock 453 and differential input 476. APLL 405 has a control bus 415 for control of the phase shift input to APLL 405's phase mixer.

Acquisition of a sample value can proceed as follows.

DPS 1600 can assert, through the JTAG connection 1612 to internal controller 402, a read ADC signal 454. The value read from ADC 452 (actually, the value read is the last value produced by ADC 452, as stored in a buffer 459) is available to DPS 1600, for loading into a histogram array, via an ADC out bus 451. In addition, a positive edge on read ADC signal 454 can start a sequencer 458.

Sequencer 458 can first assert a trigger enable line 422. As discussed above, assertion of trigger enable line 422 can cause trigger unit 432 to produce a sample clock (or hold pulse), at its output 434, such that undersamplers 430 and 431 capture a sample of the signal at differential input 476.

Second, if ABUS enable line 427 enables the undersamplers to drive differential to single converter 448, sequencer 458 can assert a hold line 456 such that a sample is taken of a single-ended conversion of the signal sample.

Third, sequencer 458 can assert an ADC convert line 457 that causes ADC 452 to produce a digital value for the sampled single-ended signal.

Summary of APLL 100

APLL 100 (see FIG. 1) contains a feedback loop, referred to herein as a "reference clock loop," that acts to phase and frequency lock a VCO 103 with a reference clock 111.

Each output 120 to 127 of VCO 103 provides the same frequency, but at a different phase. Expressed in degrees, there is an ordering of the eight VCO 103 outputs such that each output differs, from a succeeding and a preceding output, by 360/8 or 45 degrees.

While any one of outputs 120 to 127 could be used, VCO clock 121 (also referred to as clock 453 in FIG. 4A) is shown as the output that causes trigger unit 432 to produce sample clock edges at output 434.

In general, a phase mixer takes N clock inputs of the same frequency but different phases and, in response to a phase shift control signal, interpolates between two of the input phases. The phase mixer outputs the interpolated phase.

The phase mixer design of APLL 100 has eight clock inputs (labeled 130 to 137), a 10 bit wide phase shift control signal "PS_139" and the interpolated phase is at output 138. The three most significant bits of PS_139 (e.g., PS_139[9:7]) select one of the eight pairs of clock inputs that differ by 45 degrees. The seven least significant bits of PS_139 (e.g., PS_139[6:0]) set a position of phase interpolation between the selected pair of inputs.

Because of the reference clock loop, in the absence of changes at input PS_139, the outputs of VCO 103 are phase and frequency locked with reference clock 111. Input PS_139 can be loaded with any value, under the program control of DPS 1600, through JTAG connection 1612.

In FIG. 4A, reference clock 111, of the APLL 405, is connected to a reference clock via connection 1620. Since transmitter 1614 is sending data to IC 1611 in synchronization with reference clock 1620, it can be seen that clock 453, produced by APLL 405, is synchronized with the signal at differential input 476.

Increments to the value input to phase mixer 105, at PS_139, cause the phase relationship, between any output of VCO 103 (e.g., output 121 that produces clock 453) and the signal at differential input 476, to be shifted.

Summary of S-Parameter Capture

A broadband signal can be used to ascertain a channel's $S_{21}$ measurement. The broadband signal, sent by the transmitter, is designed to stimulate the channel across a spectrum of interest. The response of the channel to such a broadband signal, if the broadband signal is periodic, can be measured from coherent undersampled data captured at the receiver location.

A function of received periodic content can be constructed by concatenating the mean value for each one dimensional histogram (one such histogram for each temporal location). The Fourier transform of the broadband signal as received after transmission through the channel (such received broadband signal determined from the constructed function of received periodic content), divided by the Fourier transform of the transmitted broadband signal, constitutes the $S_{21}$ of the channel.

An example apparatus for determining a channel's $S_{21}$ measurement can be comprised of a transmitter board 902, a backplane board 901 and a receiver board 903.

Transmitter board 902 can comprise a physically contiguous transmitter integrated circuit 924. Transmitter IC 924 can comprise a transmitter 922 that transmits data from a multiplexer 921. Multiplexer 921 can select either a typical source of data 920 or a pattern generator 923. The typical source of data 920 can be data as typically transmitted, from transmitter board 902 to receiver board 903, when the $S_{21}$ characteristic is not being measured.

Pattern generator 923 can generate a broadband pattern that is injected into the channel and is received by the receiver board 903. In particular, receiver board 903 can receive the injected pattern with an IC 1611.

Pattern generator 923 need not be on transmitter IC 924, however it can be desirable to integrate pattern generator 923 on the same transmitter IC 924.

Receiver board 903 can comprise an IC 1611 as discussed above. Specifically, on the same physically contiguous IC 1611 can be integrated both a receiver circuit, at which an $S_{21}$ is to be measured, along with an undersampler for taking the needed measurements of the received broadband signal.

The $S_{21}$ of a channel (also known as the "through transmission"), referred to herein as $C_f(n)$, is the Fourier transform of the signal received via the channel, referred to herein as $R_f(n)$, divided by the Fourier transform of the transmitted signal, referred to herein as $T_f(n)$, where $T_f(n)$ is the signal that produced $R_f(n)$. Expressed in equation form:

$$C_f(n) = \frac{R_f(n)}{T_f(n)}$$

where $T_t(n)$ and $R_t(n)$ are, respectively, the time domain versions of $T_f(n)$ and $R_f(n)$. $T_f(n)$ can be found from $T_t(n)$, and $R_f(n)$ can be found from $R_t(n)$, by applying the Discrete Fourier Transform (DFT).

Since $T_t(n)$ has periodic content of finite length, the space of potential patterns for $T_t(n)$ can be searched for those patterns of content that maximize a particular metric. A metric that can be used, discussed further below, is maximizing the minimum power level, across the spectrum of interest. Based upon the highest frequency of interest, and the highest frequency which can reasonably be expected to be delivered to the receiver, a minimum effective sample rate at which to collect $R_t(n)$ can be determined which avoids aliasing high frequency components down into the range of frequencies of interest.

$C_f(n)$ is a vector of complex numbers comprising both phase and magnitude information. In many applications, only the magnitude information is used.

The frequency resolution of $C_f(n)$ can be increased by increasing the time duration of the pattern injected into the channel.

In general, over the period of $T_t(n)$, noise energy in the channel can be approximated as constant and uniform across the spectrum of interest. Different patterns for $T_t(n)$, however, can inject different amounts of signal energy into the channel at different frequencies (i.e. different patterns have different spectra).

In general, to maximize the signal to noise ratio, a pattern can be selected for $T_t(n)$ that maximizes the minimum power across the spectrum of interest. This constraint can be utilized by constructing a pattern generator that generates all permissible patterns, and weighting the desirability of each such pattern according to the metric of its minimum power level across the relevant portion of spectrum.

BRIEF DESCRIPTION OF THE DRAWINGS

The accompanying drawings, that are incorporated in and constitute a part of this specification, illustrate several embodiments of the invention and, together with the description, serve to explain the principles of the invention:

FIG. 5A depicts an example phase mixer design.

FIG. 10A depicts an example $T_t(n)$ and $R_t(n)$, while

DETAILED DESCRIPTION OF PREFERRED EMBODIMENTS

Reference will now be made in detail to preferred embodiments of the invention, examples of which are illustrated in the accompanying drawings. Wherever possible, the same reference numbers will be used throughout the drawings to refer to the same or like parts.

| Table of Contents to Detailed Description |
| --- |
| 1. Undersampling Overview |
| 2. Further Considerations For An Undersampling System |
| 3. Undersampling Implementation |
|    3.1. Undersampler 403, Internal Operation |
|    3.2. Trigger Unit Type 404, Internal Operation |
|    3.3. Example Computing Environment |
| 4. APLL 100 |
|    4.1. Reference Clock Loop |
|    4.2. VCO 103 |
|    4.3. Phase Mixer 105 |
|       4.3.1. Overview |
|       4.3.2. Further Details |
|    4.4. APLL 405 of IC 1611 |
| 5. S-Parameter Capture |
|    5.1. DFT Determination |
|    5.2. Signal to Noise Considerations |
|    5.3. AC Coupled Receivers |
|    5.4. Example Pattern |
|    5.5. Example Search Procedure |
| 6. Glossary of Selected Terms |

The present invention comprises techniques for undersampling, with the purpose of producing a histogram output, where the undersampler, and the receiver circuit whose input is to be undersampled, are integrated on the same physically contiguous integrated circuit.

1. Undersampling Overview

In full sampling, an input signal can be sampled without need for synchronization between a sample clock and the input signal. The sample frequency, however, must be high enough to permit the highest frequency component of interest, in the input signal, to be captured. Specifically, the frequency of the sample clock must be at least twice the frequency of the highest frequency component to be captured.

An advantage of undersampling is that the sampling frequency can be arbitrarily low. To obtain this advantage, however, the input signal and sample clocks must be synchronous to a reference clock.

Figure 3:
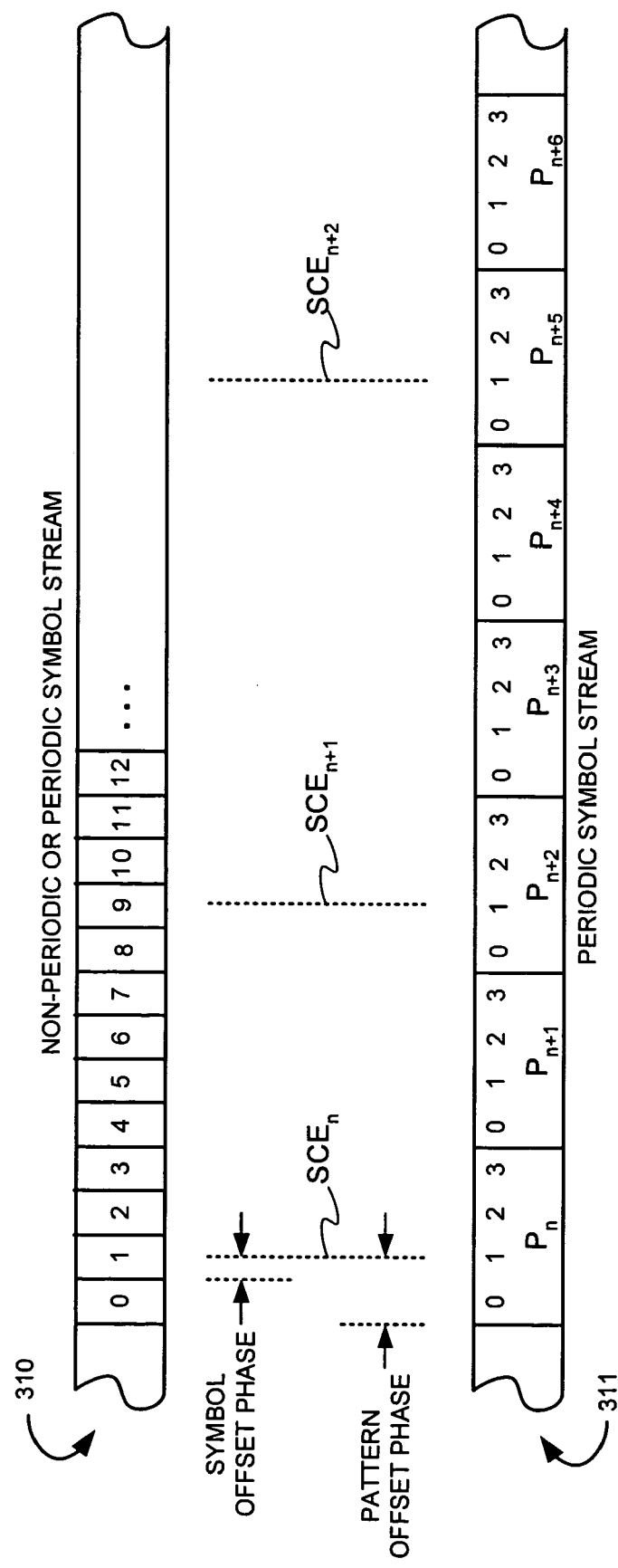
FIG. 3 depicts symbol offset phase for a symbol stream and pattern offset phase for a periodic symbol stream.

Because the input signal and sample clocks are synchronous to the same reference clock, the sample clocks have a certain offset phase, referred to herein as a "symbol offset phase," with respect to each symbol of the input signal. Symbol offset phase is illustrated in FIG. 3: FIG. 3 shows an input signal as a stream of symbols 310, where the symbols are sequentially labeled. Several sample clock edges (SCEs) are also shown in FIG. 3: $SCE_n$, $SCE_{n+1}$ and $SCE_{n+2}$. $SCE_n$ and $SCE_{n+1}$ are shown as having a symbol offset phase such that they occur halfway through the temporal extent of, respectively, symbols 1 and 9.

A symbol stream, such as 310, can be either periodic or non-periodic, and it will still have a certain symbol offset phase. To have a pattern offset phase, however, in addition to having a symbol offset phase, a symbol stream needs to be periodic.

Sample clocks can have a pattern offset phase, with respect to the content of a periodic symbol stream, if the time period between sample clocks is an integer multiple of the pattern period. The example coherent symbol stream 311 of FIG. 3 is comprised of a four-symbol pattern, with the symbols of the pattern labeled 0 to 3. Sample clocks $SCE_n$, $SCE_{n+1}$ and $SCE_{n+2}$ are shown occurring halfway through symbol 1 of the pattern.

Sample clocks that are spaced apart integer multiples of a pattern period can be referred to as performing "coherent" undersampling of a symbol stream. Coherent undersampling can be characterized by its ability to reconstruct a pattern, or a portion of a pattern, as a signal.

Sample clocks that sample a non-periodic symbol stream can be referred to as performing "incoherent" undersampling of the symbol stream. Also, sample clocks of a periodic sample stream, where the spacings between the sample clocks are prime relative to the periodicity in the data content to be sampled, can be referred to as performing "incoherent" undersampling of the symbol stream. Incoherent undersampling can be characterized by its ability to capture a "data eye" in which the various types of transitions that occur, over a symbol interval, are overlaid.

For a given phase (symbol and, possibly, pattern) of sample clocks relative to an input signal, the input signal is sampled until a sufficient number of samples are collected. Such samples can be stored in a one dimensional histogram array associated with the current phase of the sample clocks relative to the input signal.

The phase of the sample clocks, relative to the input signal, can then be shifted. Such phase shift can be accomplished by a component referred to herein as a "phase mixer" (discussed further below). The phase shift can be in accordance with a fixed increment, in accordance with a fixed direction, and small enough to provide sufficient resolution in a composite sampled image of the input signal.

For each phase increment, samples can be taken and stored in a one dimensional histogram associated with the current phase of the sample clock relative to the input signal.

When a sufficient number of phase increments have been sampled, such that a sufficiently temporally wide segment of the input signal is assembled, as a two dimensional histogram that is a temporally-ordered array of one dimensional histograms, the undersampling process can be stopped.

The phase mixer can operate by shifting sample clocks, relative to the input signal, in accordance with an amount of phase shift indicated at a "PS" input to the phase mixer. The PS input to the phase mixer can be specified as an n-bit value, with a range from zero to $2^n-1$, corresponding to phase shifts from zero to two symbol intervals. The range of phase shift available with a phase mixer, resulting from varying its phase shift input from zero to $2^n-1$, can be measured in degrees as 360 degrees.

While the PS input to the phase mixer has a finite range, the range of phases that can be selected, by repeated application of the phase mixer, is not limited. Repeated application of the PS input is analogous the setting of time with a mechanical clock by controlling the minute hand: each complete revolution of the minute hand changes the hour hand by one hour, but continued wrapping-around by the minute hand suffices to continue advancing the hour hand through multiple hours. Similarly, the PS control to the phase mixer has a circular range: advancing the control through an interval corresponding to it's nominal range (0 to $2^n-1$) plus one more bit returns the PS control to the same value; however the phase of the input signal has been advanced two entire symbols.

Figure 6A:
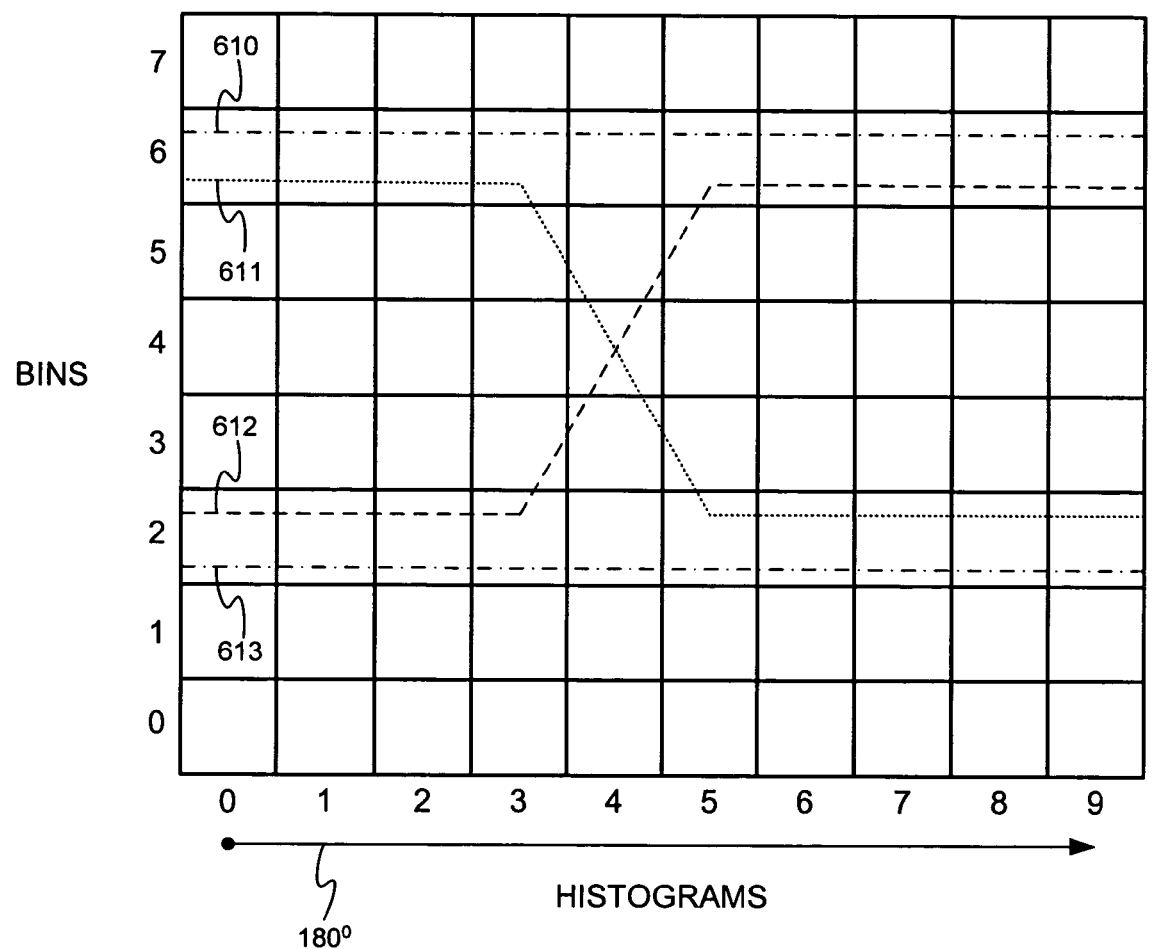
FIGS. 6A and 6B depict an example two dimensional histogram resulting from incoherent undersampling.
Figure 6B:
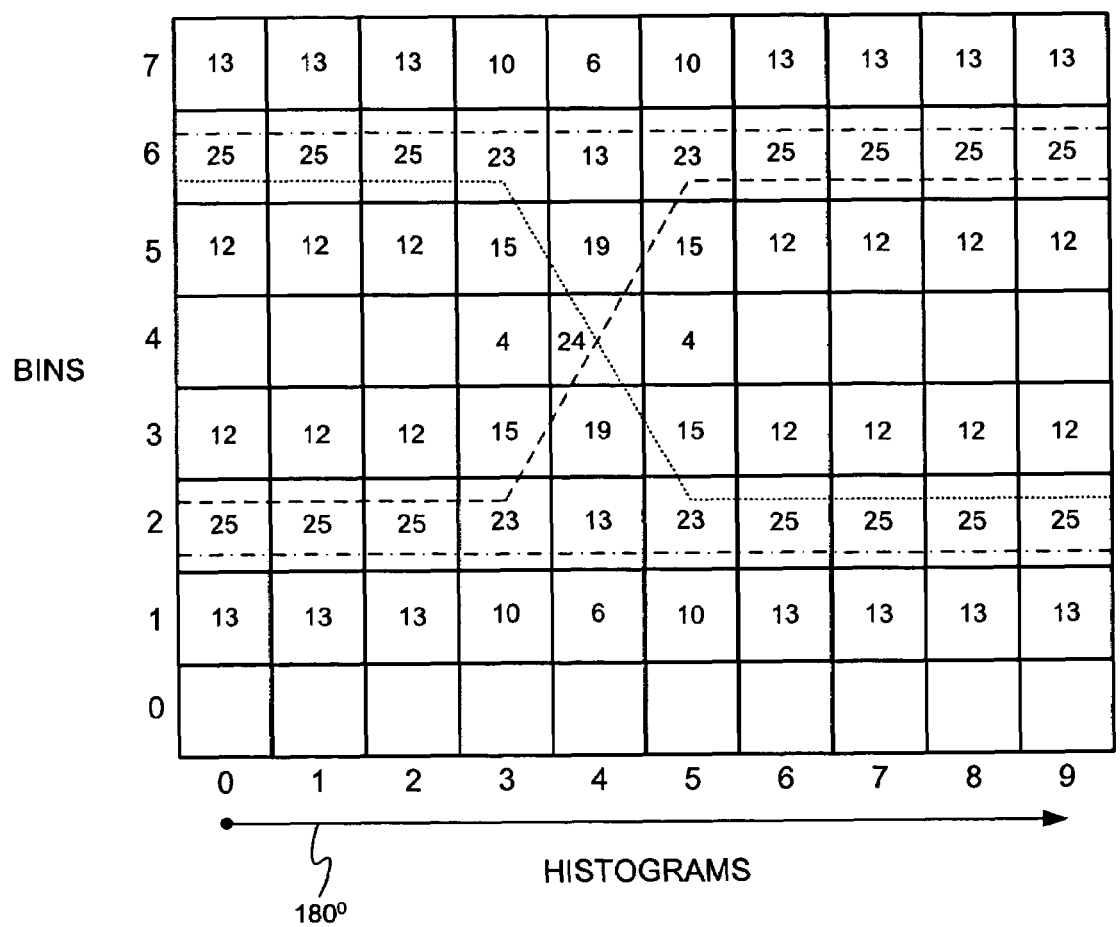

FIGS. 6A and 6B depict an example of incoherent undersampling.

FIGS. 6A and 6B depict an array of 10 one dimensional histograms (numbered 0 to 9), each histogram having 8 bins (numbered 0 to 7).

Also depicted in FIGS. 6A and 6B are the four types of transitions (labeled 610, 611, 612 and 613 in FIG. 6A and unlabeled in FIG. 6B) for a binary encoded signal that are sampled by incoherent undersampling, where the temporal extent of the 10 histograms corresponds to the temporal extent of one bit period. The symbol offset phase, between the input signal and the sample clocks, is such that histogram 0 corresponds to halfway through a bit while histogram 8 corresponds to halfway through a following bit. Signal transitions 610, 611, 612 and 613 are shown in ideal form, without accounting for such real world effects as noise or variation in the generated signal.

FIG. 6B depicts an example result for the array of one dimensional histograms, when undersampling transitions 610, 611, 612 and 613 with variations due to real world effects. Each one dimensional histogram of FIG. 6B has a total of 100 samples. The bins with the greatest number of hits are those that lie directly on the ideal paths of the transition types. However, the histograms also show the spreading of hits, beyond the ideal signal paths, due to real world signal variation.

Figure 7A:
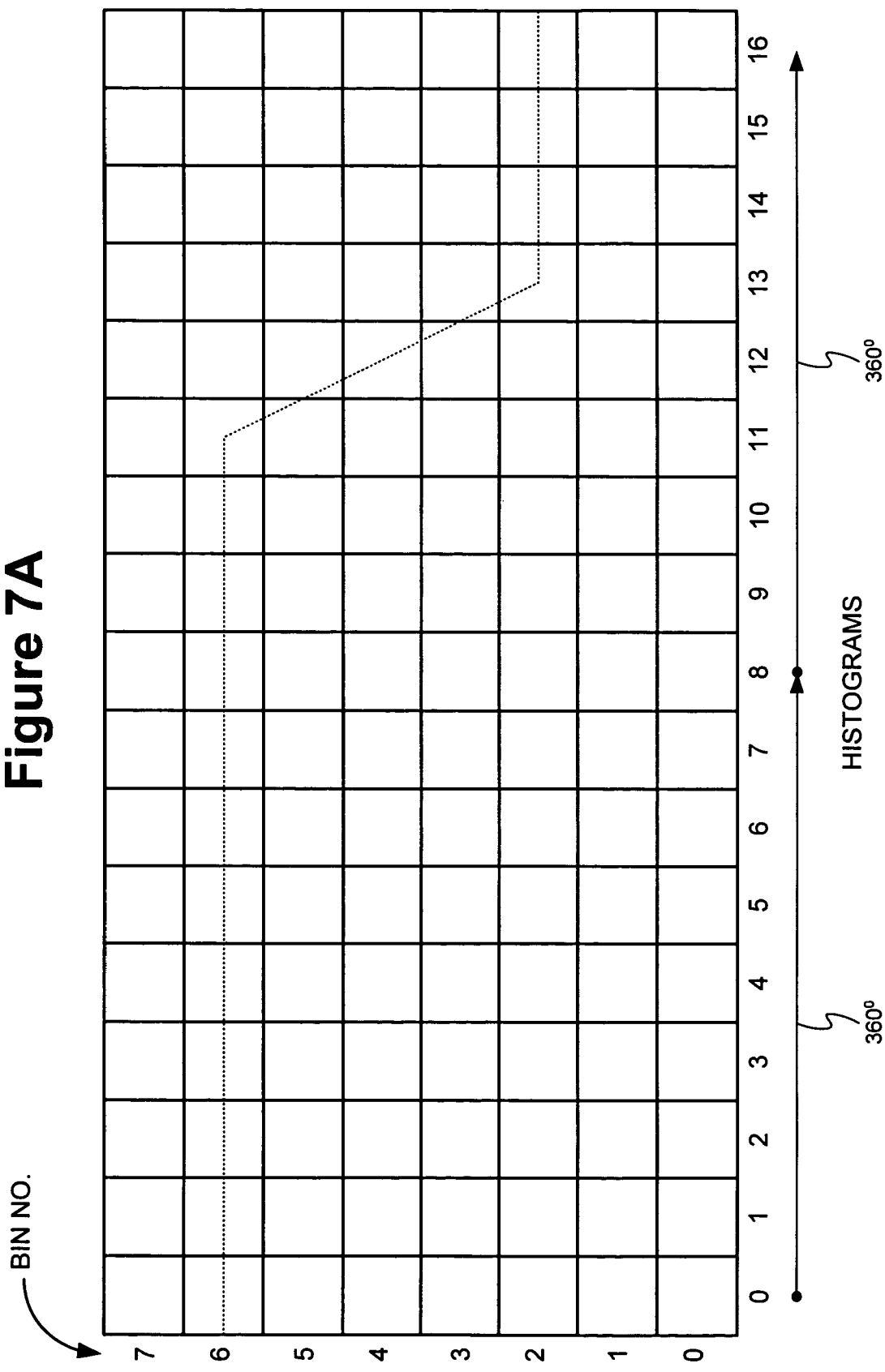
FIGS. 7A and 7B depict an example two dimensional histogram resulting from coherent undersampling.
Figure 7B:
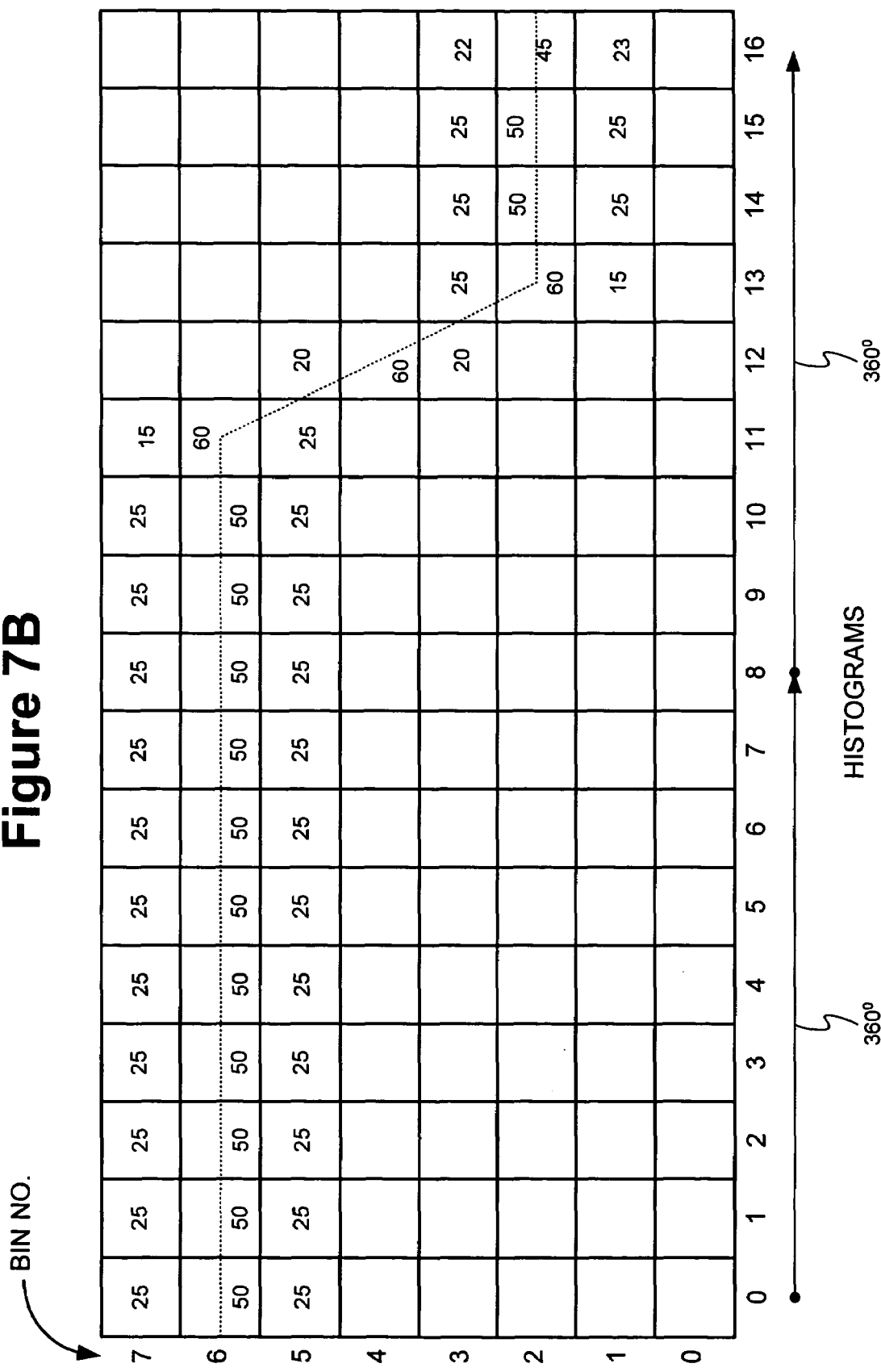

FIGS. 7A and 7B correspond, respectively, to FIGS. 6A and 6B, but depict a coherent undersampling example where each one dimensional histogram corresponds to a particular pattern offset phase.

For coherent undersampling, where the desired output is a function suitable for further processing, from the temporally ordered array of one dimensional histograms, a mean value can be computed from each one dimensional histogram, resulting in a vector of mean values versus time.

2. Further Considerations for an Undersampling System

In general, the maximum temporal resolution of an undersampling system can depend on the amount of phase shift, measured in symbol intervals, per unit increment of the phase mixer's PS input. An example undersampling system is presented herein where each 360 degree phase-shift, specified at the PS input, is divided into 1024 increments (i.e., the phase mixer's phase shift control input is 10 bits) and corresponds to two symbol intervals of the under-sampled differential signal. Thus, each unit increment of the phase mixer corresponds to a phase shift of $$\frac{1}{512}$$

of a symbol interval.

In general, the maximum signal-level resolution of an undersampling system can depend upon the resolution of its ADC. An example undersampling system is presented herein where the signal-level resolution comprises $2^{13}$ signal levels as a result of using a 13-bit ADC.

In general, acquisition time, to obtain an undersampled image of a signal, remains constant as the signal-level resolution is increased, if the number of samples collected per one dimensional histogram is held constant.

If a visual representation is desired, for a two dimensional histogram, it can be desirable to increase the signal-level resolution such that visually smooth and continuous waveforms are presented. In an embodiment of an undersampling system, presented further below, 512 levels, of signal-level resolution, can be used. A suitable unit of signal level (e.g., an amount of volts or amperes), per unit of signal-level resolution, can be determined from a peak-to-peak measurement of the signal to be displayed. Such peak-to-peak measurement can be compressed into less than a full-scale signal-level representation (e.g., into 80% of a full-scale signal-level representation) such that succeeding peaks or troughs of the input signal, that may be outside the range of a particular peak-to-peak measurement used to establish the unit amount of signal-level resolution, do not exceed the full-scale of representable signal-level.

For purposes of generating a visual representation, the number of samples per bin can be converted into an appropriate color with a color map. Prior to applying the number of samples per bin to a color map, it can be desirable to normalize the number of samples per bin. An example normalization technique is dividing the value in each bin by the value of the bin with the largest number of samples, thereby converting the value in every bin to be within the range of zero to one. The normalized values can then be multiplied by a number equal to the maximum input value of the color map and then input to the color map.

In general, if the total number of samples collected per one dimensional histogram is held constant, as the number of bins per one dimensional histogram is increased, the maximum number of samples collected, in any one bin, decreases. If the ratio, between the number of bins and the total number of samples collected, becomes too great, the maximum number of samples per bin can become too close to the minimum number of samples per bin to provide for a suitable level of visual differentiation when the bin contents are color mapped. Such a result can also occur if the acquisition time is too short, but fast acquisition time can be an advantage and the collected signal representation can be sufficient for certain purposes.

Even if there is a large range, between those bins with a maximum number of samples and those bins with relatively few samples, it can still be desirable to be able to distinguish, visually, among those bins containing relatively few samples. Log-based color mapping can be used to accomplish this. In one approach, the log is found for each normalized bin value. Such log value is then scaled and shifted into the range of the color map. Scaling can be accomplished by multiplying the log by a scaling factor. Shifting converts the logs into values that are greater than, or equal to, zero, and can be accomplished by adding an offset.

Another approach is to design the color map itself to logarithmically map from changes in input number to changes in color, such that color change, per unit change of the input number, is greater towards the lower value end of color map input. For example, bins with 1 and 10 samples can be mapped to colors providing greater contrast than the colors for bins with 1000 and 1100 samples.

To emphasize the difference between those bins containing relatively few samples and those bins containing zero samples, a color map can be used wherein there is a visually pronounced difference between the color assigned to zero samples per bin and the colors assigned to those bins with relatively few samples.

3. Undersampling Implementation

Figure 8A:
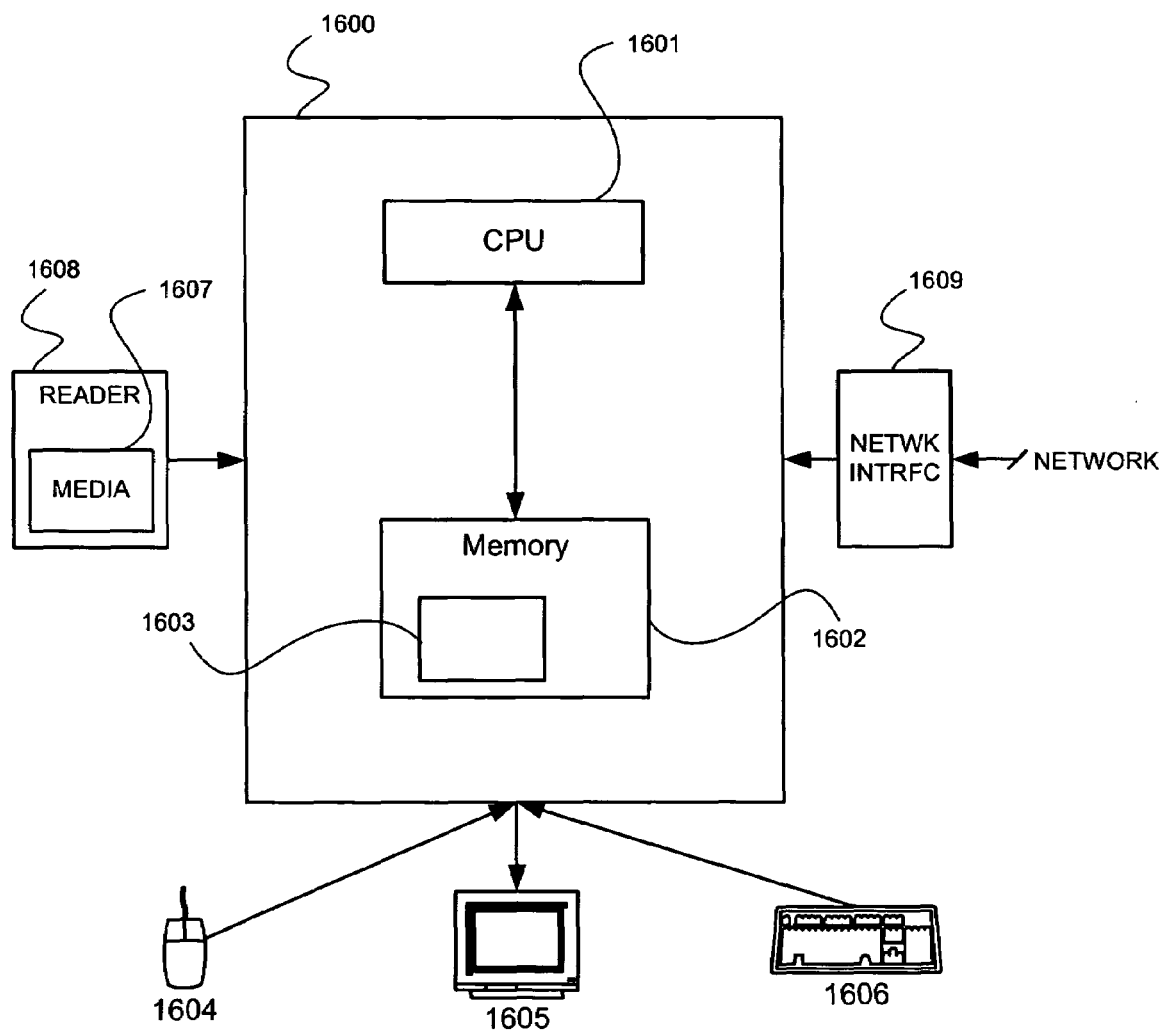
FIG. 8A depicts DPS 1600 as a type of data processing system known as a personal computer.
Figure 8B:
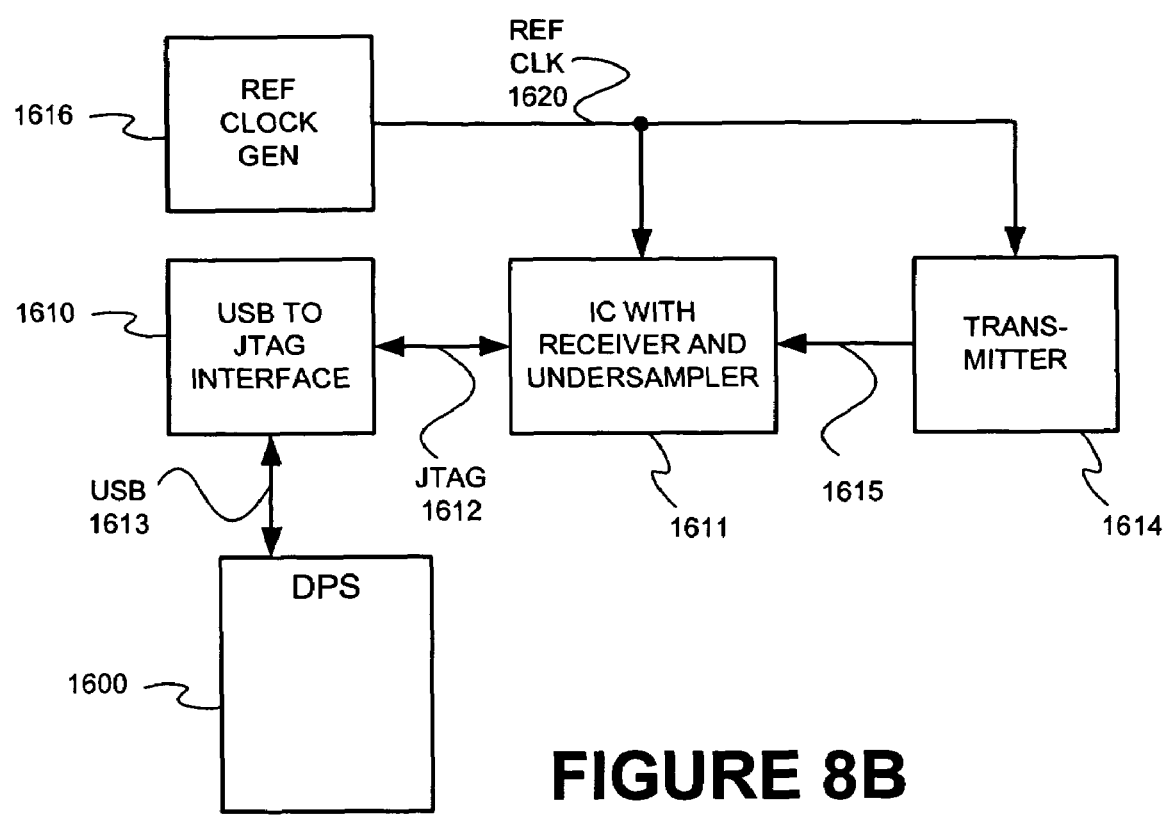
FIG. 8B depicts an example overall equipment arrangement in which undersampling can be used.

FIG. 8B depicts an example overall equipment arrangement in which undersampling can be used. Data Processing System 1600 can be any stored-program computer suitable for receiving data values, as a result of undersampling, and producing a histogram thereof. FIG. 8A depicts DPS 1600 as a type of data processing system known as a personal computer.

FIG. 8B depicts the following equipment. An example "USB" (i.e., Universal Serial Bus) connection 1613 between DPS 1600 and a USB-to-JTAG interface unit 1610 (where "JTAG" refers to the "Joint Test Action Group" that developed the IEEE 1149.1 boundary-scan standard). An example JTAG connection 1612 couples interface unit 1610 and an integrated circuit 1611. IC 1611 has integrated, on the same physically contiguous IC, both an undersampler circuit and a receiver circuit whose input is to be monitored by undersampling. A connection 1615, that carries the differential signal to be undersampled, couples transmitter 1614 to the receiver on IC 1611.

In order to use undersampling, transmitter 1614 and the undersampler of IC 1611 must be synchronized to the same reference clock. In FIG. 8B, a single reference clock generator 1616 distributes, via connection 1620, a reference clock to both transmitter 1614 and the undersampler of IC 1611.

Figure 4A:
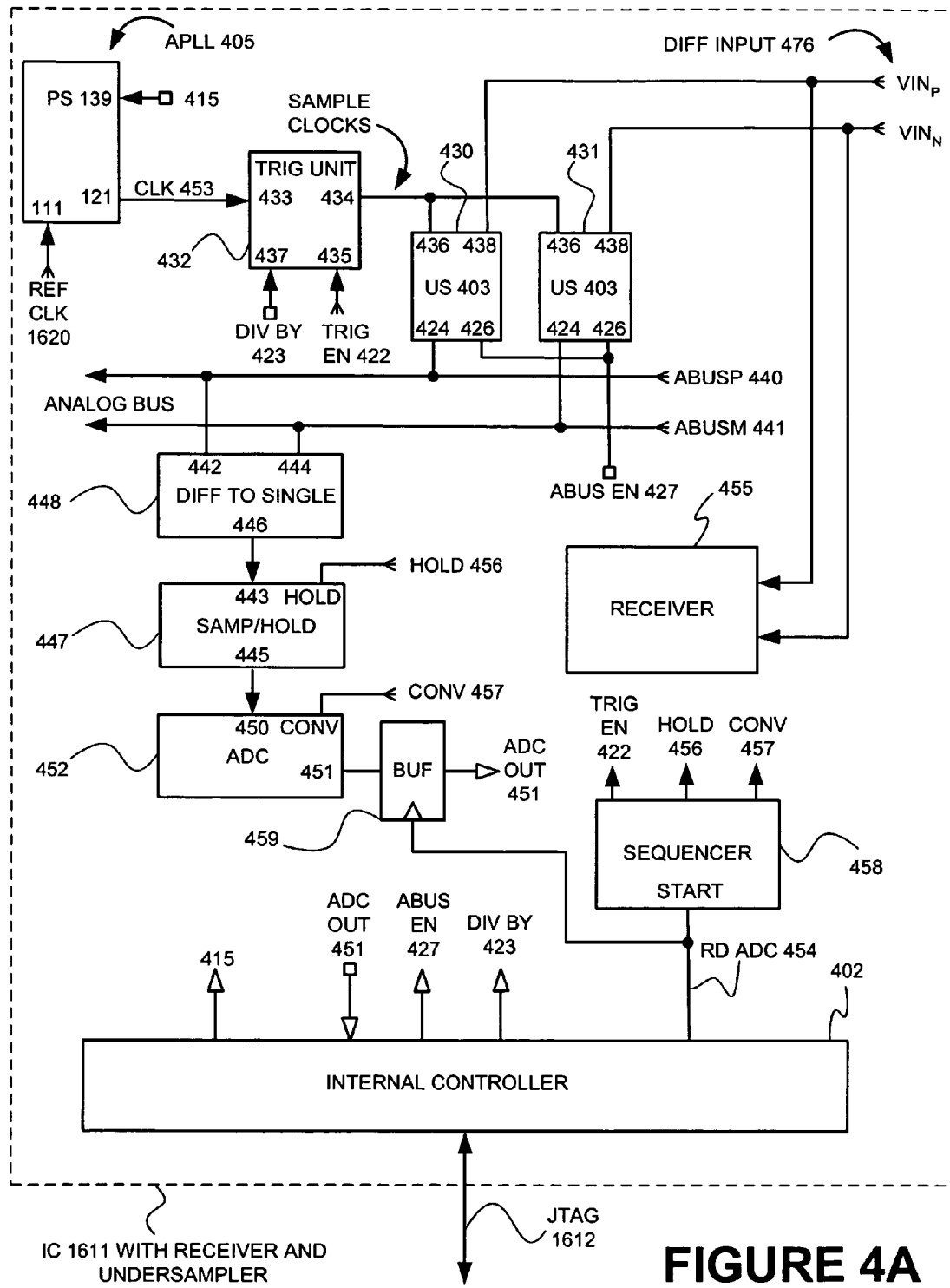
FIG. 4A depicts an example apparatus for an IC 1611 that includes both a receiver and undersampler.

FIG. 4A depicts an example apparatus for IC 1611. The example receiver circuit, whose input is to be monitored by undersampling, is shown on IC 1611 as a receiver block 455. Receiver block 455 receives its input from IC 1611's differential input 476. An example data rate, for a differential signal to be applied to differential input 476, is 6.25 Gigabaud/sec and an example data encoding is binary. APLL 405 can be an instance of type APLL 100 (APLL 100 is discussed in section "APLL 100") and has a control bus 415 for control of the phase shift input to APLL 405's phase mixer. IC 1611 contains an internal controller 402 that interfaces with a control bus input, such as JTAG bus 1612, to produce or receive control signals for accomplishing the sampling. Also on IC 1611 are two instances, US 430 and US 431, of an undersampler of type 403 (type 403 to be discussed below and in section "Undersampler 403, Internal Operation"). US 430 and 431 sample, respectively, inputs $VIN_P$ and $VIN_N$ of differential input 476.

An example contents, for the physically contiguous extent of IC 1611, is indicated in FIG. 4A by the dashed outline. While FIG. 4A shows IC 1611 as containing more than just a receiver block 455 and undersamplers 430 and 431, another example embodiment of the invention can just include a receiver circuit (such as receiver block 455) and an undersampler or undersamplers (such as undersamplers 430 and 431) on the same physically contiguous integrated circuit.

A functional overview of an undersampler of type 403 follows, while internal details of its operation are covered in a below section. The node to be sampled is connected to input 438, while input 436 controls whether input 438 is "tracked" or "held." For the example of FIG. 4C, tracking of input 438, onto sample capacitor 460, occurs while input 436 is high. While tracking input 438, a signal level (e.g., a voltage level) previously transferred to a hold capacitor 463 in US 403 can be driven onto its output 424 (and therefore onto an analog bus, called "ABUSP 440" or "ABUSM 441") by asserting output enable 426.

Figure 4B:
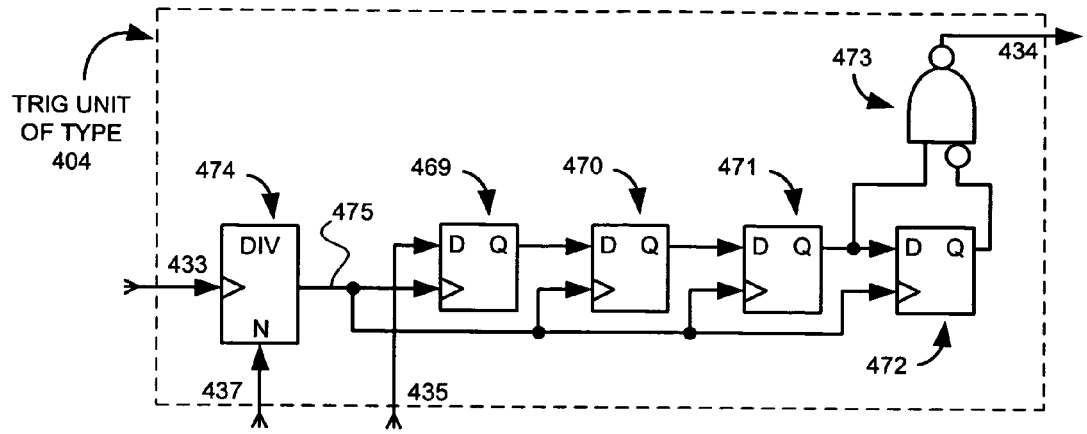
FIG. 4B depicts internal details of a trigger unit of type 404.

The undersamplers can be controlled by a trigger unit 432. Output 434 of trigger unit 432 produces the sample clocks referred to in the above section "Undersampling Overview." Trigger unit 432 is an instance of a trigger unit of type 404, whose internal details are shown in FIG. 4B. A functional overview of trigger unit type 404 follows, while a discussion of its internal details of operation are covered in a below section. In its steady state, trigger unit 404 outputs a high signal at 434 causing the undersamplers to track. Trigger unit 404 can change the level at 434 to low, causing the undersamplers to hold, when trigger enable input 435 is asserted. In addition to enable input 435 being asserted, the condition needed, for the level at 434 to go low, is a sufficient number of clock edges (in this example, positive edges) at input 433. Trigger unit 404 can comprise a divide-by-N counter 474, of clock input 433, where N can be adjustable by an input 437. The value of N can be set to accomplish coherent undersampling. Undersampling of a signal with periodic content is coherent when the period of the sample clock, produced by the counter 474, is an integer multiple of the signal-content periodicity.

Where the pattern for coherent sampling is of fixed length (e.g., 80 bits) counter 474 can always divide by the same amount (e.g., 40, where two bits of the pattern occur for each clock edge at input 433). A fixed value for counter 474, set to accomplish coherent sampling for a particular pattern, will not have a detrimental effect on incoherent sampling, so long as the sampling period set by counter 474 is prime relative to any periodicity in the data content to be incoherently sampled.

Clock input 433 of trigger unit 432 is clocked by an output of APLL 405 of FIG. 4A. The functionality of APLL 405 is comprised of two parts. First, to produce a clock 453 synchronized with reference clock 1620. Second, to provide a phase mixer, as described above, for shifting the phase relationship between clock 453 and differential input 476.

As explained below, in the section "APLL 100," APLL 405 can comprise an instance of APLL 100 along with a register for setting values of the phase mixer's phase shift input PS 139.

Acquisition of a sample value can proceed as follows.

DPS 1600 can assert, through USB to JTAG interface 1610, a read ADC signal 454. ADC 452 can output a value from a previous request that ADC 452 perform an analog to digital conversion. A positive edge on read ADC signal 454, therefore, can load a previous conversion value from ADC 452 into a buffer 459. The value of buffer 459 is available to DPS 1600, for loading into a histogram array, via an ADC out bus 451. In addition, a positive edge on read ADC signal 454 can start a sequencer 458.

Sequencer 458 can first assert a trigger enable line 422. As discussed above, assertion of trigger enable line 422 can cause trigger unit 432 to produce a sample clock (or hold pulse), at its output 434, such that undersamplers 430 and 431 capture a sample of the signal at differential input 476. If ABUS enable line 427 is asserted, the captured sample can be driven by undersamplers 430 and 431 onto the analog bus. Differential to single converter 448 can convert the differential signal, on the analog bus, into a single-ended signal at its output 446. The single-ended signal at output 446 can be sampled by input 443 of sample and hold unit 447.

Second, sequencer 458 can assert a hold line 456 such that a sample is taken of the single-ended signal at output 446. The sample taken by sample and hold unit 447 is a (single-ended) discrete time analog value, available to ADC 452 for conversion into a discrete time digital value.

Third, while still asserting hold line 456, sequencer 458 can assert an ADC convert line 457 that causes ADC 452 to produce a digital value for the sampled signal at ADC signal input 450.

Fourth, once ADC 452 has produced a digital value, sequencer 458 can de-assert hold line 456.

3.1. Undersampler 403, Internal Operation

Figure 4C:
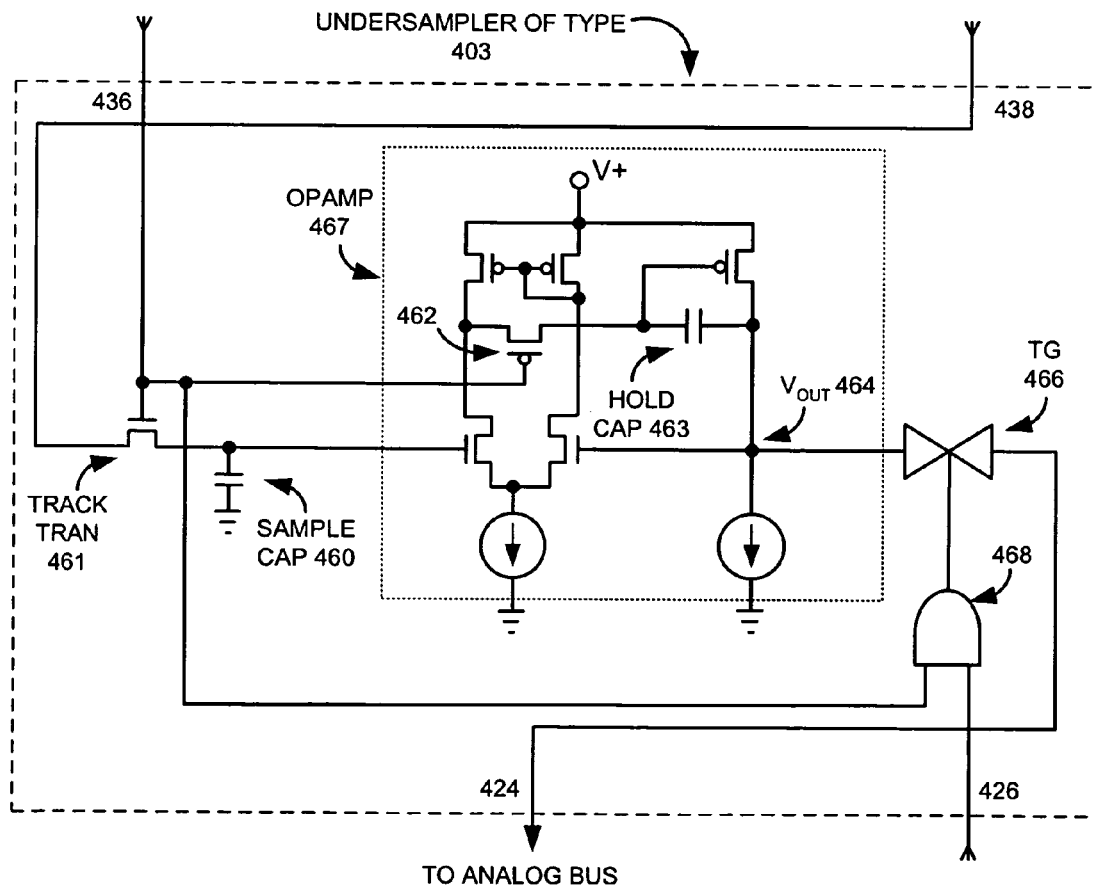
FIG. 4C depicts the internals of an undersampler.

The internals of an undersampler of type 403 are shown in FIG. 4C. As can be seen, the node to be sampled is connected to input 438, while input 436 controls whether input 438 is "tracked" (by sample capacitor 460) or "held." In the example of FIG. 4C, input 438 is tracked when input 436 is high.

When input 436 is low, the voltage of sample capacitor 460 is held by turning off tracking transistor 461. Also, when 436 is low, holding capacitor 463 is charged according to a predetermined relationship with sample capacitor 460. More specifically, when input 436 is low, transistor 462 transfers to holding capacitor 463 the voltage which is required to produce, at $V_{OUT}$ 464, the voltage of sample capacitor 460. Such transfer from the sample to hold capacitors can be accomplished by a unity-gain operational amplifier, indicated by outlined region 467. Operational amplifier 467 drives the voltage at $V_{OUT}$ 464 to equal the voltage across sample capacitor 460.

Holding capacitor 463 can be much larger than sample capacitor 460. For example, holding capacitor 463 can be large enough to hold its charge until an analog-to-digital conversion of the charge has been completed. By having a separate holding capacitor 463, sampling capacitor 460 can be made small enough to permit a sufficiently high bandwidth data signal to be received by receiver circuit 455. However, sampling capacitor 460 still needs to be large enough to permit a charge to be established on holding capacitor 463.

When input 436 returns high, the operational amplifier output voltage at $V_{OUT}$ 464, caused by the charge trapped on holding capacitor 463, can be driven onto an analog bus (e.g., "ABUSP 440" or "ABUSM 441") by enabling transmission gate 466. When transmission gate 466 is initially enabled, the voltage at $V_{OUT}$ 464 can be expected to change due to the capacitance of the analog bus. However, operational amplifier 467 eventually charges the analog bus to the voltage caused by the charge trapped on hold capacitor 463.

Input 436 is depicted as directly coupled to the following three components of FIG. 4C: tracking transistor 461, transistor 462 and AND gate 468. However, input 436 can be connected to these three components with non-overlapping clocks. Non-overlapping clocks can be used to ensure that a switch, through which a capacitor has been charged, is opened prior to enabling or disabling other circuits. The time difference, between opening such capacitor-charging switch and enabling or disabling other circuits, can be equal to the following: several times the delay associated with an inverter in the relevant technology.

In the example of FIG. 4C, when input 436 transitions to a low signal value, non-overlapping clocks can be used to ensure that tracking transistor 461 turns off before both of the following occur: transistor 462 turns on and transmission gate 466 is disabled. When input 436 transitions to a high signal value, non-overlapping clocks can be used to ensure that transistor 462 turns off before both of the following occur: tracking transistor 461 turns on and transmission gate 466 is enabled.

3.2. Trigger Unit Type 404, Internal Operation

Each time counter 474 produces a positive edge, it clocks D-type flip-flops 469 to 472 simultaneously. If a logical one is present at trigger enable input 435, this logical one is clocked, by positive edges from counter 474, into flip-flops 469 to 471. When a logical one is present at the Q output of flip-flop 471 and a logic zero is present at the Q output of flip-flop 472, AND gate 473 transitions to a logic zero at its 434 output. Due to the asynchronous relationship between trigger enable input 435 and the edges of counter 474, it can take two or three edges of counter 474 before a logic one is at the Q output of flip-flop 471. Due to the asynchronous relationship between trigger enable input 435 and the edges of counter 474, there can be metastability problems at the output of flip-flop 469 that can be addressed by adding flip-flops 470 and 471.

With trigger enable 435 still high, when the next positive edge is produced by counter 474, a logic one is also clocked into flip-flop 472, causing output 434 to go high.

When trigger enable 435 is returned low, over the next three to four positive edges from counter 474, a logic zero is clocked into flip-flops 469 to 472. With a logical zero is present at the Q output of flip-flop 471, output 434 remains high until trigger enable 435 is once again brought high.

3.3. Example Computing Environment

The data processing of samples, captured by the present invention, can be accomplished by a computing environment (or data processing system) such as that of FIG. 8A. FIG. 8A depicts a personal computer 1600 comprising a Central Processing Unit (CPU) 1601 (or other appropriate processor or processors) and a memory 1602. Memory 1602 has a portion of its memory 1603 in which are stored the software tools (or computer programs) and data of the present invention. While memory 1603 is depicted as a single region, those of ordinary skill in the art will appreciate that, in fact, such software and data may be distributed over several memory regions or several computers. Furthermore, depending upon the computer's memory organization (such as virtual memory), memory 1602 may comprise several types of memory (including cache, random access memory, hard disk and networked file server). Computer 1600 can be equipped with a display monitor 1605, a mouse pointing device 1604 and a keyboard 1606 to provide interactivity between the software of the present invention and the equipment designer or maintainer. Computer 1600 also includes a way of reading computer readable instructions from a computer readable medium 1607, via a medium reader 1608, into the memory 1602. Computer 1600 also includes a way of reading computer readable instructions via the Internet (or other network) through network interface 1609.

In some embodiments, computer programs embodying the present invention are stored in a computer readable medium, e.g. CD-ROM or DVD. In other embodiments, the computer programs are embodied in an electromagnetic carrier wave. For example, the electromagnetic carrier wave may include the programs being accessed over a network.

4. APLL 100

4.1. Reference Clock Loop

APLL 100 (see FIG. 1) contains a feedback loop, referred to herein as a "reference clock loop," that acts to phase and frequency lock VCO 103 with a reference clock 111. An example frequency for reference clock 111 is 625 MHz. Specifically, the loop acts to vary the frequency of VCO 103 such that the output of divider 104 is phase locked with reference clock 111. When the signal to be undersampled, at differential input 476 (see FIG. 4A), encodes 6.25 Gigabaud/sec, divider 104 can divide by five such that the reference clock loop acts to frequency lock VCO 103 to 3.125 GHz.

The reference clock loop, of APLL 100, operates as follows.

Phase differences, between reference clock 111 and the output of divider 104, are detected by phase detector 101. The output of phase detector 101 is filtered by Charge Pump/Low Pass Filter 102 to produce a signal for controlling VCO 103. While VCO 103 can provide eight clock outputs, labeled in FIG. 1 as outputs 120 to 127, for purposes of the reference clock loop, VCO 103 can be regarded as having a single frequency-controlled output. Also, for purposes of the reference clock loop, phase mixer 105 can be regarded as simply a wire that couples a single frequency-controlled output of VCO 103 to the input of divider 104.

4.2. VCO 103

Each output 120 to 127 of VCO 103 provides the same frequency, but at a different phase. The phase differences can be illustrated with a "phase circle" diagram, shown in FIG. 5B.

Figure 5B:
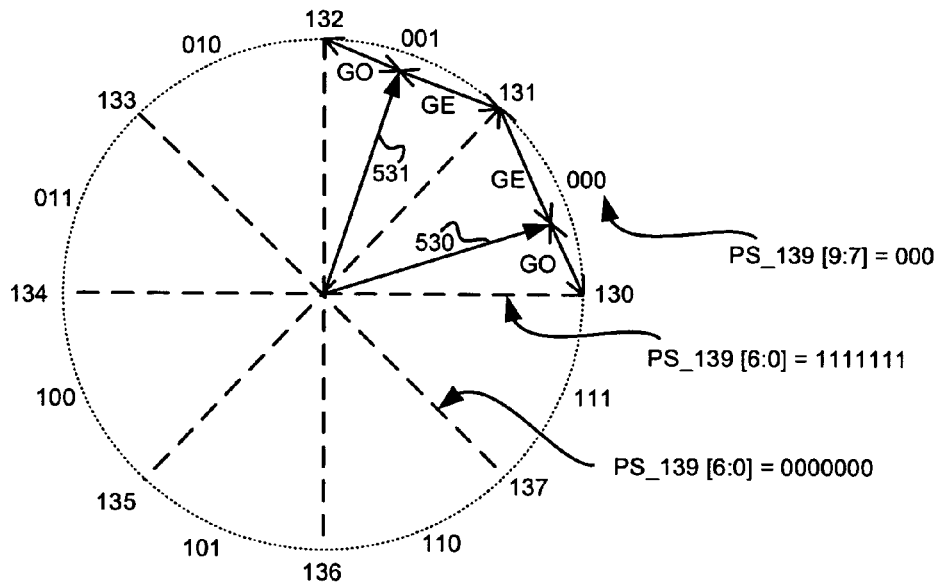
FIG. 5B depicts an example phase circle.

FIG. 5B represents a complete cycle, of any output of VCO 103, as a complete circle (or 360 degrees). In general, the phases of the outputs of VCO 103 are such that, when placed upon a phase circle diagram, they divide the circumference of the circle into equal-sized segments of arc. Expressed in terms of degrees, this means that, for an N output VCO 103, there is an ordering of the N outputs such that each output differs, from a succeeding and a preceding output, by 360/N degrees. In the case where VCO 103 has eight outputs, the case shown in FIG. 5B, the phases of the outputs divide the circumference of the phase circle into eight equal sized segments. The eight equal sized segments are numbered in binary, in FIG. 5B, from 000 to 111. Expressed in degrees, there is an ordering of the eight VCO 103 outputs such that each output differs, from a succeeding and a preceding output, by 360/8 or 45 degrees.

Figure 2:
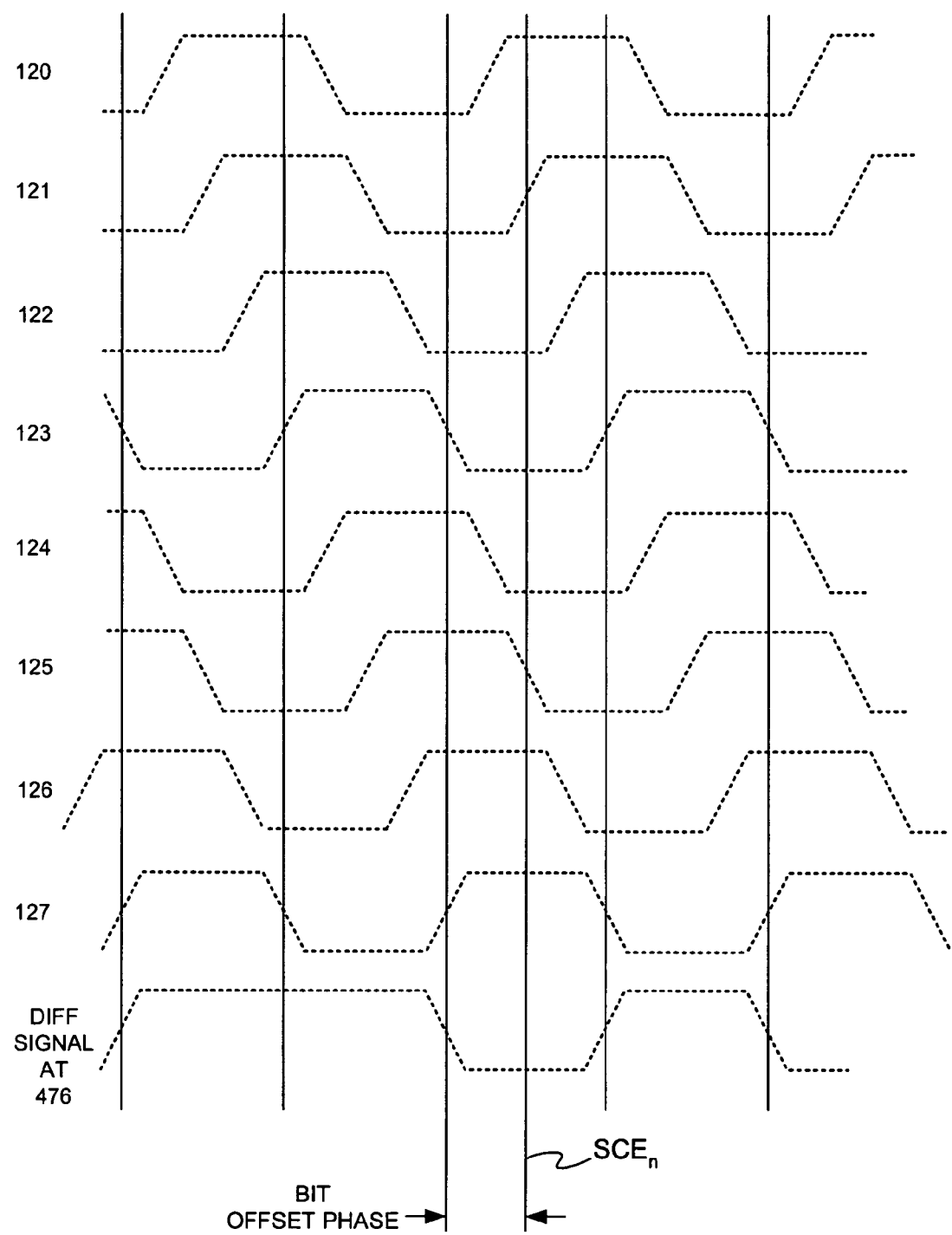
FIG. 2 depicts a timing diagram of eight outputs of a VCO relative to an example signal.

FIG. 2 depicts a timing diagram of these eight outputs relative to an example differential signal at input 476 of FIG. 4A. Each of the eight selected outputs of VCO 103 differs from a succeeding and a preceding output by 45 degrees.

FIG. 2 also shows an edge of VCO clock 121 (also referred to as clock 453 in FIG. 4A) as the edge that causes trigger unit 432 to produce a sample clock edge n ($SCE_n$) at output 434. An example bit phase offset, for such a sample clock, is also shown in FIG. 2.

4.3. Phase Mixer 105

4.3.1. Overview

In general, a phase mixer takes N clock inputs of the same frequency but different phases and, in response to a phase shift control signal, interpolates between two of the input phases. The phase mixer outputs the interpolated phase.

Figure 1:
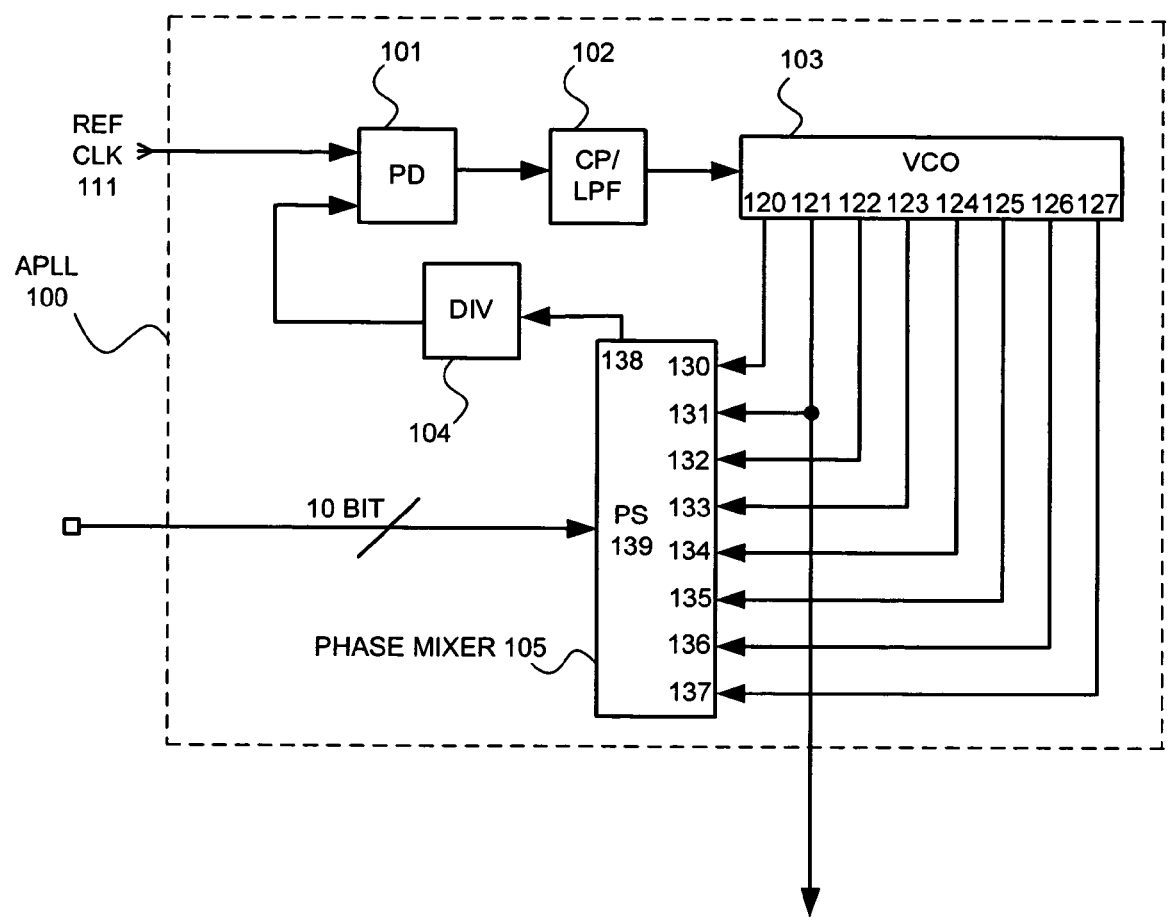
FIG. 1 depicts an APLL unit.

An example phase mixer design is shown in FIG. 5A, and FIG. 1 shows an instance 105 of such design. The phase mixer design of FIG. 5A has eight clock inputs (labeled 130 to 137), a 10 bit wide phase shift control signal "PS_139" and the interpolated phase is at output 138. The three most significant bits of PS_139 (e.g., PS_139[9:7]) select one of the eight arcs depicted in the phase circle of FIG. 5B (i.e., they select a pair of clock inputs, one from multiplexer 512 and the other from multiplexer 513, that differ by 45 degrees). The seven least significant bits of PS_139 (e.g., PS_139[6:0]) set a position of phase interpolation along the selected arc (i.e., they set a position of phase interpolation between the selected pair of clock inputs).

For example, in FIG. 5B, when PS_139[9:7] is equal to 111, the pair of inputs 137 and 130 are selected. For PS_139[6:0] equal to 0000000, the phase of input 137 is sent to output 138, while for PS_139[6:0] equal to 1111111, the phase of input 130 is sent to output 138. For values of PS_139[6:0] that are between 0000000 and 1111111, an interpolation, between the phases of 130 and 137, is sent to output 138. Details, of how phase mixer 105 can accomplish such interpolation, are presented below.

4.3.2. Further Details

A pair of points on the phase circle of FIG. 5B, that are 45 degrees apart, is selected by applying the three most significant bits of the phase shift control 139 (PS_139 [9:7]) to multiplexers 512 and 513. Multiplexers 512 and 513 are each depicted in FIG. 5A as 8-input multiplexers whose inputs have been connected together into four pairs. For multiplexer 512, inputs 7 or 0 select phase 130, inputs 1 or 2 select phase 132, inputs 3 or 4 select phase 134 and inputs 5 or 6 select phase 136. For multiplexer 513, inputs 0 or 1 select phase 131, inputs 2 or 3 select phase 133, inputs 4 or 5 select phase 135 and inputs 6 or 7 select phase 137.

In summary, multiplexer 512 selects one of the four even-numbered inputs, located at 0, 90, 180 and 270 degrees on the phase circle. Multiplexer 513 selects one of the four odd-numbered inputs, located at 45, 135, 225 and 315 degrees on the phase circle.

The length of the chord (or the linear distance) between each pair of phases separated by 45 degrees (i.e., a pair of phases comprising one odd-numbered phase and one even-numbered phase, the phases being consecutively numbered) is normalized to a value of one. Along any such unit-distance, the seven least significant phase shift control bits (i.e., PS_139 [6:0]) select the interpolation point.

This can be accomplished by applying the selected even-numbered phase input to an adjustable gain amplifier 514 and by applying the selected odd-numbered phase input to an adjustable gain amplifier 515. The gains of even-phase amplifier 514 and odd-phase amplifier 515 are adjusted such that they always sum to a constant value. The outputs of amplifiers 514 and 515 are input to summer 516. The result of summer 516 is filtered by low pass filter 517 and converted back to full logic levels by slicer 518.

Consider the phase indicated by arrow 530 of FIG. 5B, located within the 45 degree section selected by PS_139 [9:7]=000. The closer phase 530 is to 0 degrees, the greater the gain of 514 and the less the gain of 515. This is illustrated in FIG. 5C, that shows how the gain for 514 (also referred to as "Gain Even" or GE) and for 515 (also referred to as "Gain Odd" or GO) vary with location on the phase circle.

Figure 5C:
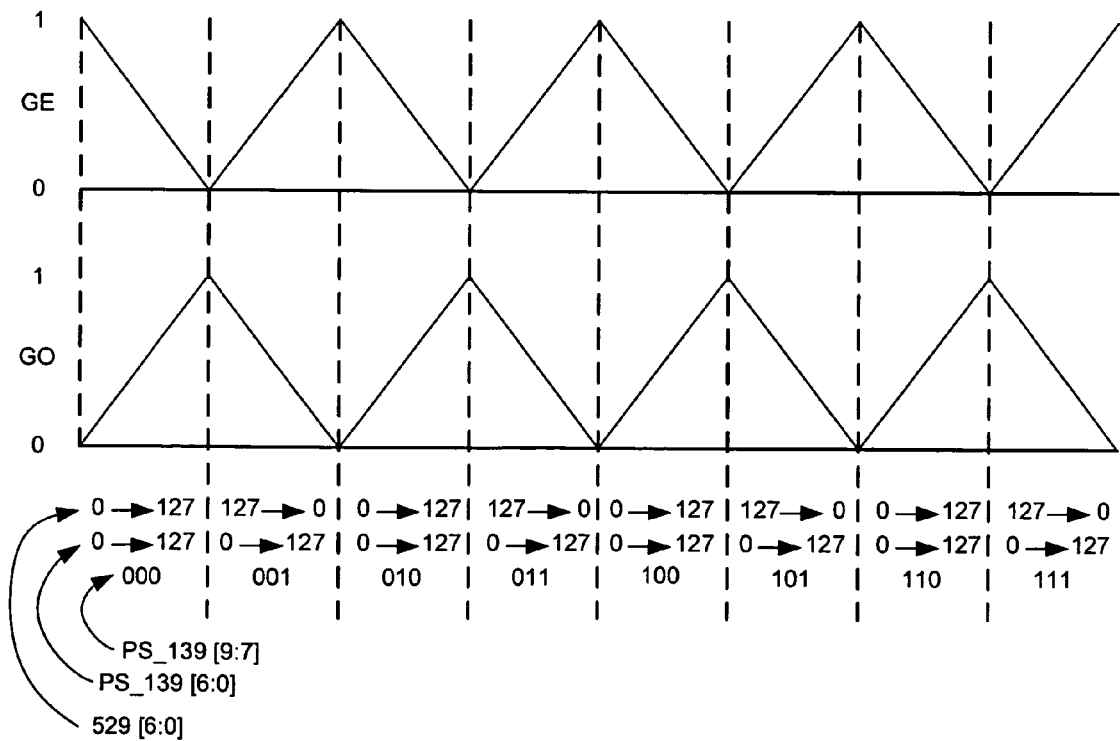
FIG. 5C shows how the "Gain Even" (or GE) and "Gain Odd" (or GO) vary with location on the phase circle.

FIG. 5C is divided into eight sections, numbered 000 to 111, in accordance with the value for PS_139 [9:7]. For each of these regions, PS_139 [6:0] increases from 0 to 127, from left to right. Within the region for PS_139 [9:7]=000, it can be seen that, as PS_139 [6:0] is increased, from 0 to 127, GE decreases while GO increases. The net result, at any point across FIG. 5C, is that the sum of GE and GO is always the normalized distance of one. FIG. 5B also shows, graphically, how the functions for GE and GO of FIG. 5C, for region PS_139 [9:7]=000, accurately model the position of phase 530 on the chord between 0 and 45 degrees. Specifically, FIG. 5B shows how phase 530 divides the chord into two sections, where the length of one section is proportional to GE and the length of the other section is proportional to GO.

Referring back to FIG. 5C, within the region for PS_139 [9:7]=001, it can be seen that, as PS_139 [6:0] is increased, from 0 to 127, the change in GE and GO becomes opposite to that for the region PS_139 [9:7]=000. Specifically, for PS_139 [9:7]=001, as GE increases GO decreases. FIG. 5B shows, graphically, how the functions for GE and GO of FIG. 5C, for region PS_139 [9:7]=001, accurately model the position of phase 531 on the chord between 45 and 90 degrees. Specifically, FIG. 5B shows how phase 531 divides the chord into two sections, where the length of one section is proportional to GE and the length of the other section is proportional to GO.

FIG. 5A shows an example embodiment for controlling the gain of 514 and 515. A digital to analog converter (DAC) 520 is depicted, that produces a GE control output 510 and a GO control output 511. For the four regions of the phase circle of FIG. 5B where PS_139 [7]=0, as PS_139 [6:0] is increased from 0 to 127, input bus 529 to DAC 520 (as shown in FIG. 5C) also increases from 0 to 127. Therefore, DAC output 510 increases GE while DAC output 511 decreases GO. For the four regions of the phase circle of FIG. 5B where PS_139 [7]=1, due to the seven XOR gates labeled 519 in FIG. 5A, as PS_139 [6:0] is increased from 0 to 127, input bus 529 to DAC 520 (as shown in FIG. 5C) decreases from 127 to 0. Therefore, DAC output 510 decreases GE while DAC output 511 increases GO.

DAC 520 is designed to provide complementary outputs 510 and 511. DAC 520 can be designed such that, if the sum of the signal levels at its outputs 510 and 511 is determined, such sum is a constant value.

4.4. APLL 405 of IC 1611

To produce clock 453 of APLL 405, any one of the eight outputs of VCO 103 can be used. For purposes of example, FIG. 4A assumes VCO output 121 is used.

Because of the reference clock loop, in the absence of changes at input PS_139, the outputs of VCO 103 are phase and frequency locked with reference clock 111. Input PS_139 can be loaded with any value, under the program control of DPS 1600, through JTAG connection 1612.

In FIG. 4A, reference clock 111, of the APLL 405, is connected to a reference clock via connection 1620. Since transmitter 1614 is sending data to IC 1611 in synchronization with reference clock 1620, it can be seen that clock 453, produced by APLL 405, is synchronized with the signal at differential input 476.

Increments to the value input to phase mixer 105, at PS_139, cause the phase relationship, between any output of VCO 103 (e.g., output 121 that produces clock 453) and the signal at differential input 476, to be shifted.

5. S-Parameter Capture

This section describes a use of coherent undersampling to perform S-Parameter capture.

When a transmitter transmits into a channel from a particular location and a receiver receives from the same channel at a particular location, the characteristics of the channel can be expressed as an $S_{21}$ measurement.

A broadband signal can be used to ascertain the channel's $S_{21}$ measurement. The broadband signal, sent by the transmitter, is designed to stimulate the channel across a spectrum of interest. The response of the channel to such a broadband signal, if the broadband signal is periodic, can be measured from coherent undersampled data captured at the receiver location. As discussed above, due to such factors as signal noise, even the coherent undersampling process captures a variety of signal values at each temporal location of a periodic pattern. The variation is captured by the use of a one dimensional histogram for each temporal location. A function of received periodic content can be constructed by concatenating the mean value for each one dimensional histogram (one such histogram for each temporal location). The Fourier transform of the broadband signal as received after transmission through the channel (such received broadband signal determined from the constructed function of received periodic content), divided by the Fourier transform of the transmitted broadband signal, constitutes the $S_{21}$ of the channel.

The "channel" depends upon what is defined to be the transmitted broadband signal. If the transmitted signal is defined to be the digital representation of the pattern to be transmitted, then every limitation of the translation of the digital representation to analog form, as well as the limitations of the wiring connecting the transmitter to the receiver, is included in the channel. If, however, the transmitted signal is a filtered version of the digital representation, then the channel will not include those transmitter limitations approximated by such filtering.

Figure 9:
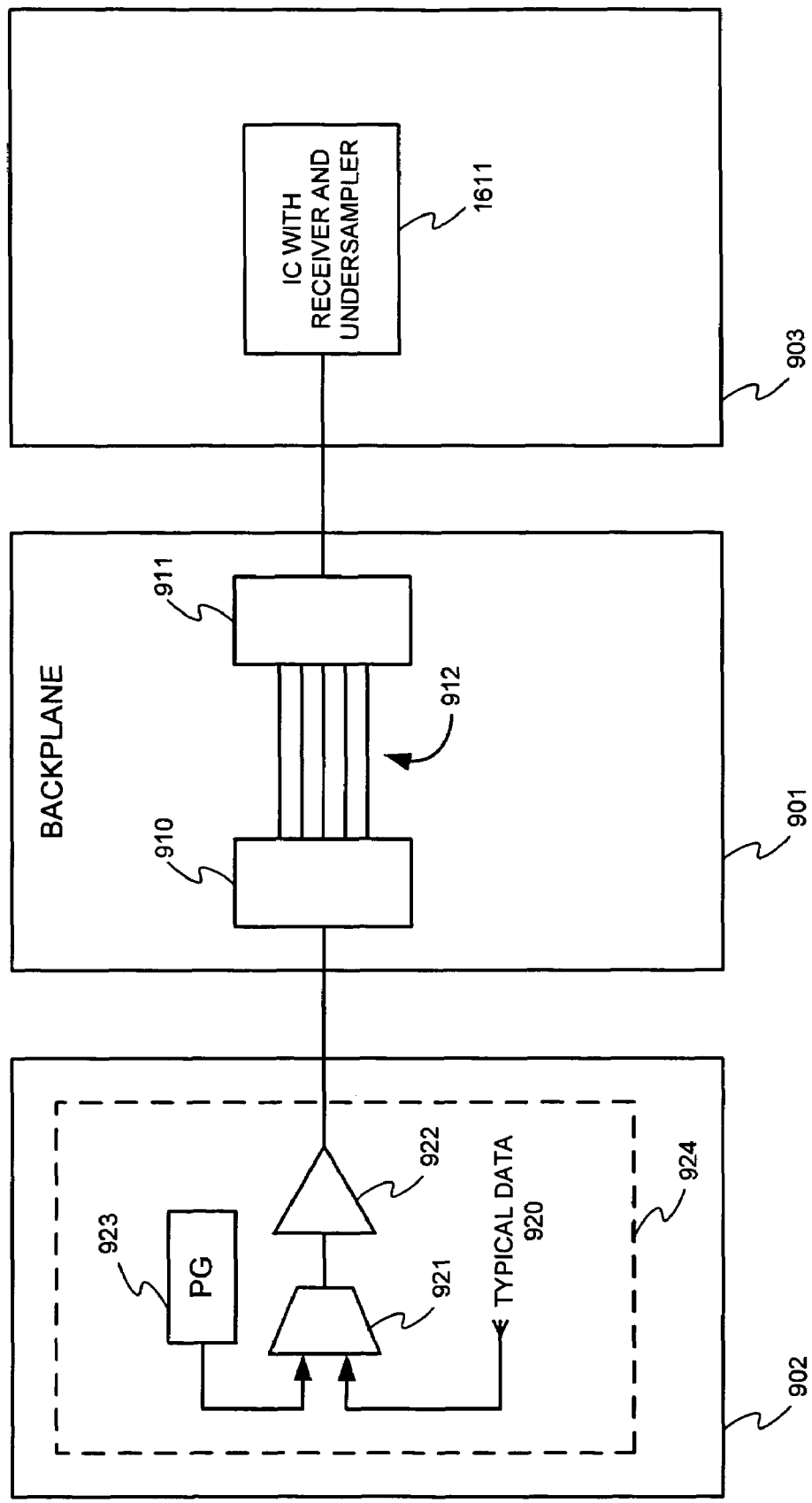
FIG. 9 depicts an example apparatus for determining a channel's $S_{21}$ measurement.

An example apparatus for determining a channel's $S_{21}$ measurement is depicted in FIG. 9. The apparatus can be comprised of a transmitter board 902, a backplane board 901 and a receiver board 903. Transmitter board 902 can connect to backplane 901 via a connector 910. Likewise, receiver board 903 can connect to backplane 901 via a connector 911. Connectors 910 and 911 can be coupled via conductors 912.

Transmitter board 902 can comprise a physically contiguous transmitter integrated circuit indicated by outline 924. Transmitter IC 924 can comprise a transmitter 922 that transmits data from a multiplexer 921. Multiplexer 921 can select either a typical source of data 920 or a pattern generator 923. The typical source of data 920 can be data as typically transmitted, from transmitter board 902 to receiver board 903, when the $S_{21}$ characteristic is not being measured.

Pattern generator 923 can generate a broadband pattern that is injected into the channel and is received by the receiver on IC 1611. An example pattern generator generates a binary pattern of 80 bits. Pattern generator 923 need not be on transmitter IC 924, however it can be desirable to integrate pattern generator 923 on the same transmitter IC 924. This desirability can be due to two factors. First, the physical packaging of the apparatus, whose channel is to be measured, can be dense and not readily admit the connection of probes through which a test pattern can be sent. Second, for channels that carry very high data rates (e.g., 6.25 Giga-bits/sec), non-integrated probes, for injecting the test pattern, can introduce significant bandwidth limitations and spectral shaping in the injected test pattern due to impedance discontinuities caused by the connection of the probes to the channel. The quality of the signal delivered from an integrated pattern generator 923 is higher due to a lack of such impedance discontinuities. Therefore, an integrated test pattern generator 923 can obtain an essentially in situ measurement of a channel's $S_{21}$ characteristic.

Receiver board 903 can comprise an IC 1611 as discussed above. Specifically, on the same physically contiguous IC 1611 can be integrated both a receiver circuit, at which an $S_{21}$ is to be measured, along with an undersampler for taking the needed measurements of the received broadband signal.

The $S_{21}$ of a channel (also known as the "through transmission"), referred to herein as $C_f(n)$, is the Fourier transform of the signal received via the channel, referred to herein as $R_f(n)$, divided by the Fourier transform of the transmitted signal, referred to herein as $T_f(n)$, where $T_f(n)$ is the signal that produced $R_f(n)$. Expressed in equation form:

$$C_f(n) = \frac{R_f(n)}{T_f(n)}$$

where $T_t(n)$ and $R_t(n)$ are, respectively, the time domain versions of $T_f(n)$ and $R_f(n)$. $T_f(n)$ can be found by applying the Discrete Fourier Transform (DFT) to $T_t(n)$ and $R_f(n)$ can be found by applying the Discrete Fourier Transform (DFT) to $R_t(n)$.

Since $T_t(n)$ has periodic content of finite length, the space of potential patterns for $T_t(n)$ can be searched for those patterns of content that maximize a particular metric. A metric that can be used, discussed further below, is maximizing the minimum power level, across the spectrum of interest. Based upon the highest frequency of interest, and the highest frequency which can reasonably be expected to be delivered to the receiver, a minimum effective sample rate at which to collect $R_t(n)$ can be determined which avoids aliasing high frequency components down into the range of frequencies of interest.

In an example embodiment, $T_t(n)$ can comprise 80 binary symbols transmitted at 6.25 Giga-bits/second. For this example $T_t(n)$, $R_t(n)$ can comprise 640 samples, or 8 samples per binary symbol. A sample frequency of 8 samples/binary-symbol indicates the highest frequency that can be captured is 25 GHz. The highest frequency of interest is less than 6 GHz, and only frequencies higher than 44 GHz in the received signal would be folded down to interfering frequencies less than 6 GHz; however, the bandlimited nature of the transmit driver, backplane channel 901, and undersampler provide large attenuation at frequencies which could alias down below 6 GHz.

Since $T_t(n)$ is a generated signal (i.e. it is a representation produced by convolving an assumed trapezoidal pulse shape with the chosen broadband data pattern), it can be "sampled" at any sample rate needed to match the sample rate used to acquire the received signal.

5.1. DFT Determination

A general formula for discrete Fourier transform (or DFT) determination is as follows:

$$X_f(n) = \sum_{k=0}^{N-1} x_t(k) e^{-j\frac{2\pi nk}{N}} \quad n = \{0, 1, \ldots N-1\}$$

where $x_t(k)$ is an array of N samples of a time domain signal. The result $X_f(n)$ ranges from the result for the zero frequency (or "DC") at $X_f(0)$ to the result for the Nyquist frequency at either $$X_f\left(\frac{N}{2}\right),$$

for N being even, or $$X_f\left(\left\lfloor\frac{N}{2}\right\rfloor\right),$$

for N being odd.

Thus, a formula for determination of $C_f(n)$ is:

$$C_f(n) = \frac{R_f(n)}{T_f(n)} = \frac{\sum_{k=0}^{N-1} R_t(k) e^{-j\frac{2\pi nk}{N}}}{\sum_{k=0}^{N-1} T_t(k) e^{-j\frac{2\pi nk}{N}}}$$

where $C_f(n)$ is a vector of complex numbers comprising both phase and magnitude information. In many applications, only the magnitude information is used. The above DFTs can be solved according to the fast Fourier transform (FFT) approach that can be particularly efficient.

A phase response can be analyzed as having two components: a component that is a linear ramp with frequency and a residual "nonlinear" component. The linear component corresponds to channel delay, while the nonlinear component accounts for channel dispersion (i.e., how the channel delays different frequencies by different amounts). $C_f(n)$ provides the information about the nonlinear phase component only; the actual channel delay cannot be determined by the techniques herein described.

The resolution of $C_f(n)$ can be determined as follows:

$$\text{res\_}C_f = \frac{1}{\text{pattern\_duration}}$$

For example, an 80 bit pattern, at 6.25 Giga-bits/sec, has a pattern_duration of $12.8 \times 10^{-9}$ sec. Using the above formula, res_$C_f$ is $78.125 \times 10^6$ Hz. Thus, the frequency resolution of the resulting $C_f(n)$ can be increased by increasing the time duration of the pattern injected into the channel.

5.2. Signal to Noise Considerations

In general, over the period of $T_t(n)$, noise energy in the channel can be approximated as constant and uniform across the spectrum of interest. Different patterns for $T_t(n)$, however, can inject different amounts of signal energy into the channel at different frequencies (i.e. different patterns have different spectra).

A pattern for $T_t(n)$, where the transmitted signal encodes binary symbols, can be a binary one followed by all zeros. For the example discussed above, comprised of 80 binary symbols, a pattern can be comprised of one binary one followed by 79 zeros. This pattern shall be referred to herein as a "pulse" pattern. A pulse pattern distributes its energy evenly across frequencies, but the total amount of energy injected is relatively low. Therefore, its $R_t(n)$ can have a relatively poor signal to noise ratio.

In general, to maximize the signal to noise ratio, a pattern can be selected for $T_t(n)$ that maximizes the minimum power across the spectrum of interest. This constraint can be utilized by constructing a pattern generator that generates all permissible patterns, and weighting the desirability of each such pattern according to the metric of its minimum power level across the relevant portion of spectrum.

5.3. AC Coupled Receivers

For systems where the receiver is AC coupled to the channel, $R_f(0)$ is zero and therefore $C_f(0)$ is zero. To obtain information on the channel's $S_{21}$ characteristic for zero frequency, extrapolation can be used. Specifically, linear extrapolation to $C_f(0)$ can be determined from $C_f(1)$ and $C_f(2)$.

5.4. Example Pattern

This section presents an example $S_{21}$ measurement where $T_t(n)$ comprises 40 binary symbols transmitted at 3.125 Giga-bits/second. For this example $T_t(n)$, $R_t(n)$ can comprise 320 samples, or 8 samples/binary-symbol. A sample frequency of 8 samples/binary-symbol indicates the highest frequency that can be captured (i.e., the Nyquist frequency) is 12.5 Giga-hertz.

The resolution of $C_f(n)$ can be determined as follows:

$$\text{res\_}C_f = \frac{1}{\text{pattern\_duration}}$$

For a 40 bit pattern, at 3.125 Giga-bits/sec, the pattern_duration is $12.8 \times 10^{-9}$ sec. Using the above formula, res_$C_f$ is $78.125 \times 10^6$ Hz.

The frequency resolution of $C_f(n)$ can also be determined by dividing the Nyquist frequency by one less than the number of values of $C_f(n)$, from zero to Nyquist frequency. For this example, the number of values of $C_f(n)$, from $C_f(0)$ to the Nyquist frequency at $C_f(160)$, is 161. Dividing $12.5 \times 10^9$ Hz by $1.6 \times 10^2$ equals $78.125 \times 10^6$ Hz.

To maximize the signal to noise ratio, a pattern can be selected for $T_t(n)$ that maximizes the metric of the minimum power across the spectrum of interest. This metric can be utilized by a search procedure that includes the following operations: generating permissible patterns and weighting such patterns according to the metric of its minimum power level across the relevant portion of spectrum. An example search procedure is discussed in the following section. A non-exhaustive search, of a total search space of $2^{40}$ possible patterns, can result in the following value for $T_t(n)$:

bits 0–9: 1011010000
bits 10–19: 1011011001
bits 20–29: 0111100110
bits 30–39: 1010001010

Figure 10A:
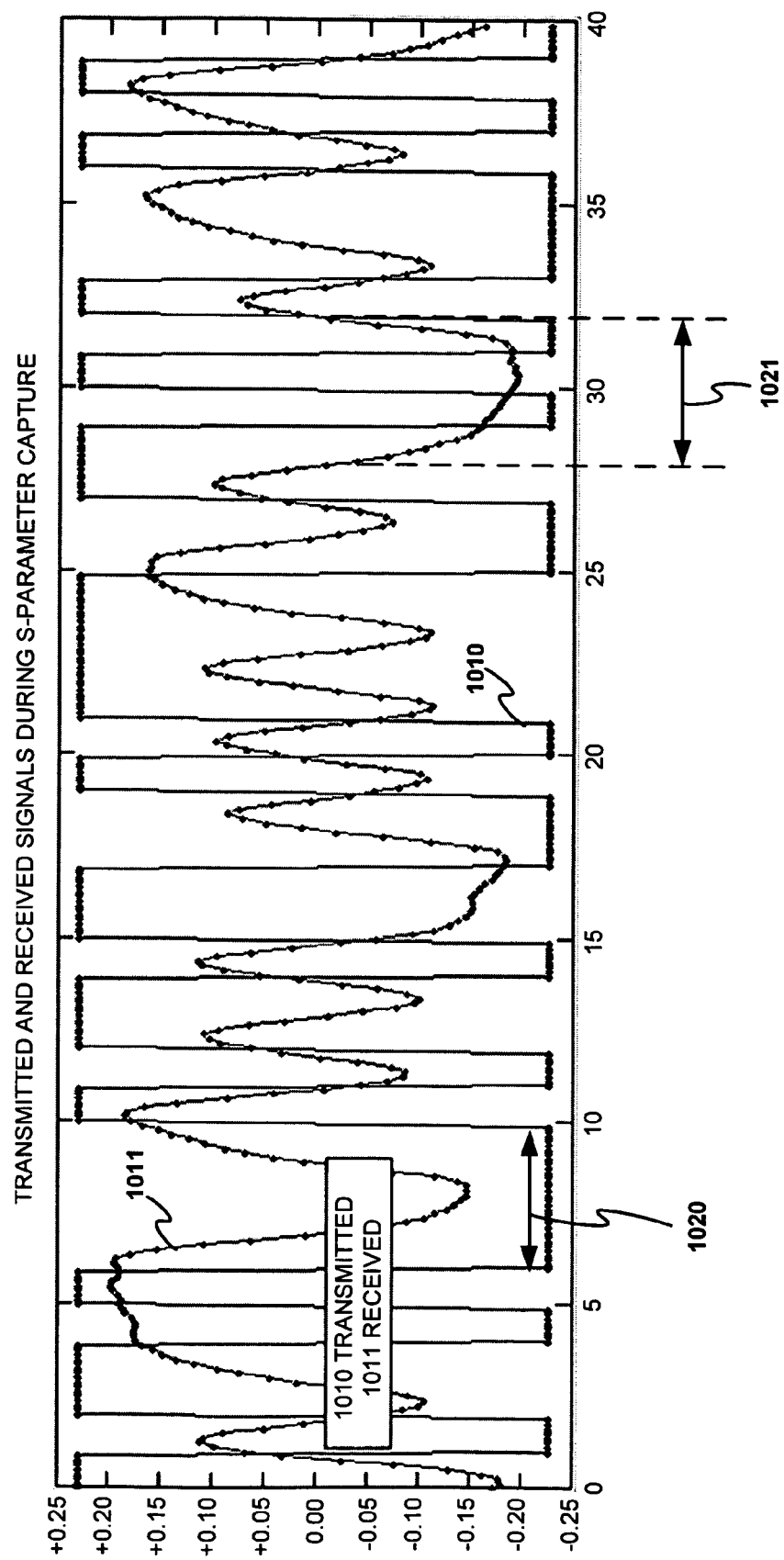

FIG. 10A depicts the above listed $T_t(n)$ as a signal 1010. Each bit of the above-listed pattern has a corresponding portion of signal 1010, in accordance with the bit-position indicated by the horizontal axis of FIG. 10A. For example, bits 6 through 9 of the above-listed pattern are zero. Examining signal 1010, for the portion corresponding to bits 6 through 9 on the horizontal axis (this portion of signal 1010 is also indicated by arrow 1020), it can be seen that signal 1010 is at −0.23 volts (where −0.23 volts corresponds to a logic zero).

Signal 1011 of FIG. 10A shows an example $R_t(n)$, received as a result of transmitting signal 1010 into a channel. Unlike signal 1010, signal 1011 is not synchronized with the horizontal axis of FIG. 10A. For example, portion 1021 of signal 1011 is a result of portion 1020 being transmitted into the channel, yet portion 1021 of signal 1011 is located, with respect to the horizontal axis, at bits 28 to 31.

Figure 10B:
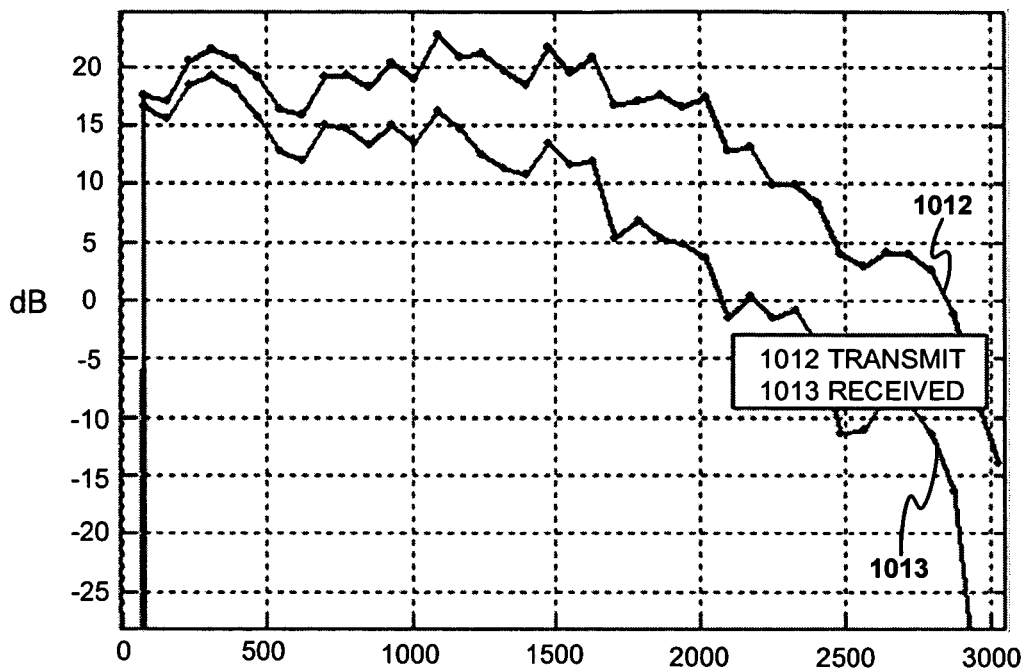
FIG. 10B depicts corresponding examples for $T_f(n)$ and $R_f(n)$.

Converting signal 1010 of FIG. 10A into its corresponding $T_t(n)$ yields spectrum 1012 of FIG. 10B. Since spectrum 1012 has only the magnitude information, it is actually a representation of $|T_t(n)|$. Similarly, converting signal 1011 of FIG. 10A into its corresponding $|R_t(n)|$ yields spectrum 1013 of FIG. 10B. Since the receiver for signal 1011 is AC coupled its spectrum 1013 has no DC component. The first unit of resolution, after DC (or zero Hertz), is at 78.125 MHz and this is the lowest frequency point of spectrum 1013 that has a non-zero value.

The suitability of the example pattern can be analyzed by examining the spectrum of interest for spectrum 1012. Assuming a data transmission system with ideal equalization available, this can be from zero Hertz up to one half the data transmission speed. Herein, one half the data transmission speed is referred to as the "Nyquist frequency of the transmitted data." In the case of this example, one half the data transmission speed of 3.125 Giga-bits/sec yields an upper end, for the spectrum of interest, of 1.5625 GHz. Assuming non-ideal equalization, however, the upper end of the spectrum of interest can be 1.3 or 1.4 times the Nyquist frequency of the transmitted data. In the case of this example, this yields an upper end, for the spectrum of interest, of about 2.0 GHz.

As can be seen in FIG. 10B, spectrum 1012 is relatively flat, or "white," from zero to about 2.0 GHz. This means that signal 1010 provides the broadband stimulus needed for S-Parameter capture.

Figure 10C:
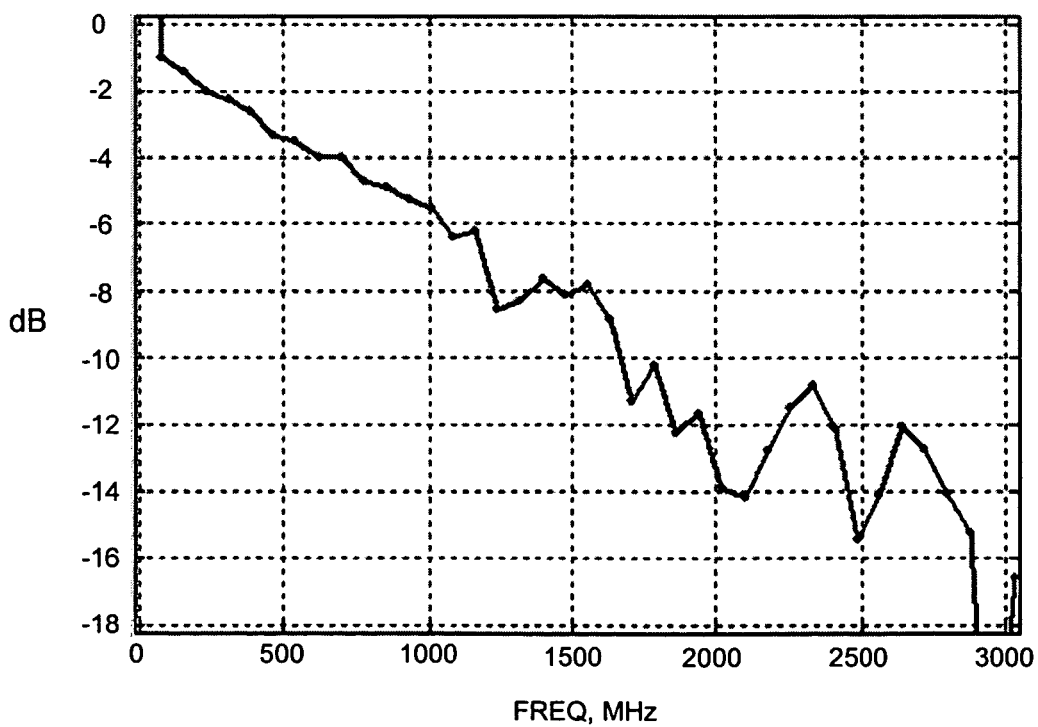
FIG. 10C shows the example $|C_f(n)|$ resulting from a division of $R_f(n)$ by $T_f(n)$.

$|C_t(n)|$ is found by dividing $|R_t(n)|$ by $|T_t(n)|$. FIG. 10C shows the $|C_t(n)|$ resulting from a division of 1013 by 1012. As discussed above, extrapolation can be used to obtain a value at DC for $|C_t(0)|$.

5.5. Example Search Procedure

Figure 11:
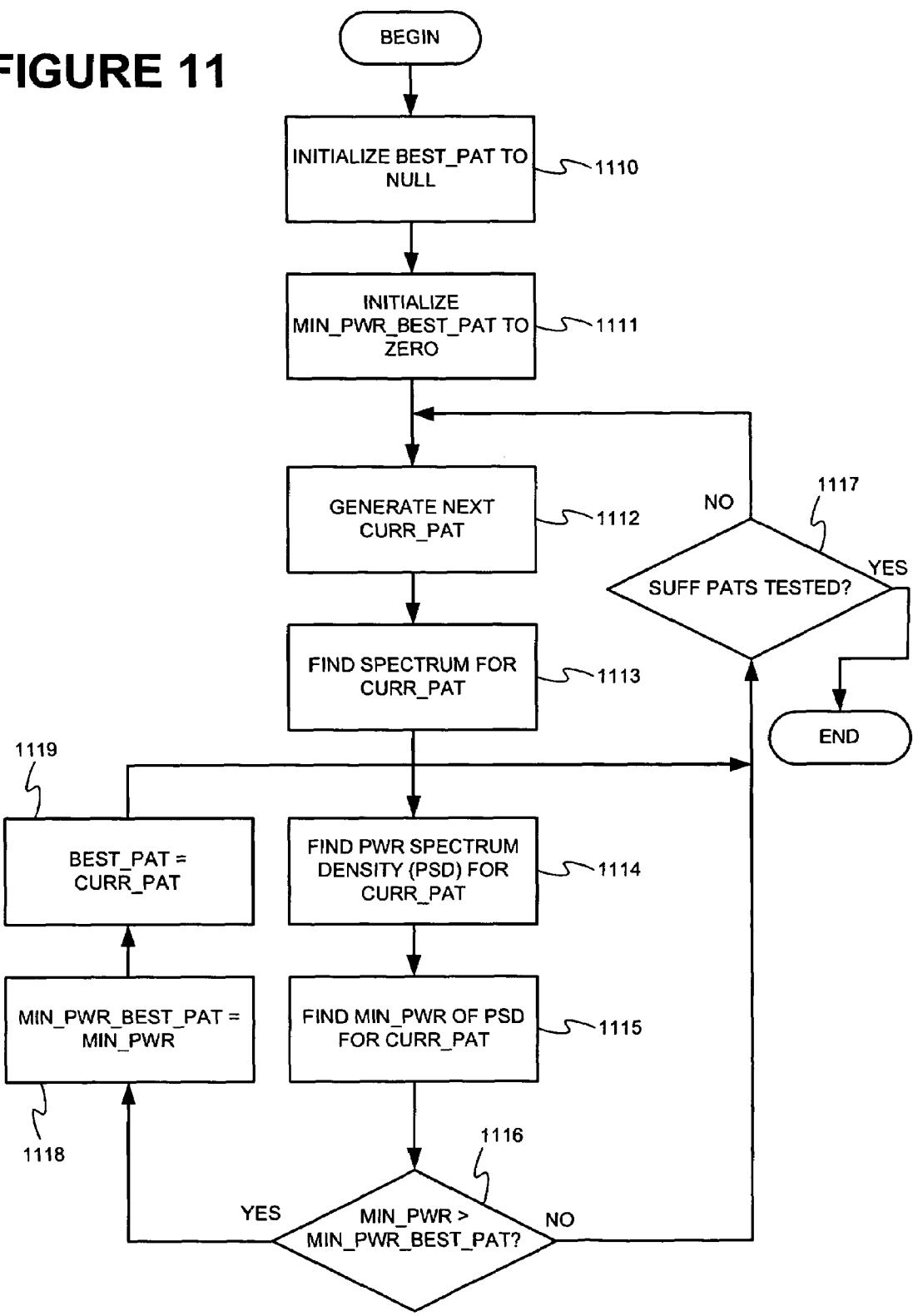
FIG. 11 depicts an example procedure that searches for a pattern for $T_t(n)$.

FIG. 11 depicts an example procedure that searches for a pattern for $T_t(n)$. The procedure seeks to find a pattern whose $T_t(n)$, for the spectrum of interest, has the greatest minimum power level.

A variable for keeping track of the best pattern found, "BEST_PAT," is initialized to null (step 1110). A variable for keeping track of the minimum power level of the best pattern found, "MIN_PWR_BEST_PAT," is initialized to zero (step 1111).

A current pattern to be tested is generated and assigned to the variable "CURR_PAT" (step 1112). The spectrum of the current pattern to be tested is found (step 1113) and its frequency domain power spectrum density (frequency domain PSD) is determined (step 1114). Step 1113 can be accomplished by an FFT, and such FFT can be squared in order to produce the result of step 1114.

The minimum power level of the PSD is found and assigned to the variable "MIN_PWR" (step 1115).

If the minimum power level of the current pattern is greater than the minimum power level of the best pattern found thus far ("yes" branch of step 1116) then the best pattern found thus far is updated (steps 1118 and 1119). After the update, if a limit on the number of patterns to be tested has not been reached (step 1117), the procedure loops back ("no" branch of step 1117) and another pattern is generated (by step 1112).

If the minimum power level of the current pattern is not greater than the minimum power level of the best pattern found thus far (the "no" branch of 1116), if a limit on the number of patterns to be tested has not been reached (step 1117), the procedure loops back ("no" branch of step 1117) and another pattern is generated (by step 1112).

6. Glossary of Selected Terms

APLL 100: Analog Phase-Locked Loop 100.
ADC: Analog to Digital Converter.
CP/LPF 102: Charge Pump/Low-Pass Filter 102.
DIS 112: Differential input signal 112.
DIV 104: Frequency divider 104.
DLPF 106: Digital Low-Pass Filter 106
DRU 115: Data Recovery Unit 115.
High signal level: corresponds to logic one.
Low signal level: corresponds to a logic zero.
PD 101: Phase Detector 101. Outputs pulses of width proportional to phase difference between its two inputs. PD 101 can be a frequency detector in addition to being a phase detector. Such frequency detection can help with startup transients.
US 403: undersampler type 403.
US 430: an instance 430 of an undersampler of type 403.
US 431: an instance 431 of an undersampler of type 403.
VCO 103: Voltage Controlled Oscillator 103.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims and equivalents.

What is claimed is:

1. A method for undersampling, comprising:
  repeating, a plurality of times:
    (i) obtaining a sample of a data signal received by a receiver circuit, the sample obtained at a phase relative to a sample clock, wherein an undersampler, for sampling the data signal, is part of an integrated circuit and the receiver circuit is part of the same physically contiguous integrated circuit, and
    (ii) adding the sample of the data signal to a one dimensional histogram associated with the phase;
  changing the phase; and
  returning to the step of repeating.

2. The method of claim 1, wherein the data signal comprises a periodically repeated content and samples obtained, at a same phase relative to a sample clock, are obtained from a same relative location of a repetition of the periodically repeated content.

3. The method of claim 2, wherein the same phase relative to a sample clock is a pattern offset phase.

4. The method of claim 2, wherein the step of changing the phase further comprises:
changing the phase, unless a sufficient number of phase increments have been sampled, such that a sufficiently temporally wide segment of the data signal is assembled as a two dimensional histogram that is a temporally-ordered array of one dimensional histograms.

5. The method of claim 4, further comprising:
approximating the data signal as a first function of time, from the two dimensional histogram representation, by finding a mean value for the received data signal at each time location of the two dimensional histogram.

6. The method of claim 1, wherein the step of changing the phase further comprises:
changing the phase, unless a sufficient number of phase increments have been sampled, such that a sufficiently temporally wide segment of the data signal is assembled.

7. The method of claim 6, wherein the sufficiently temporally wide segment of the data signal is assembled as a two dimensional histogram that is a temporally-ordered array of one dimensional histograms.

8. The method of claim 7, further comprising the step of:
displaying the two dimensional histogram as an image.

9. The method of claim 7, further comprising the step of:
normalizing at least one of the one dimensional histograms.

10. The method of claim 7, further comprising the step of:
applying a color map to at least one of the one dimensional histograms.

11. The method of claim 10, wherein the color map logarithmically maps from a change in an input number to a change in color.

12. The method of claim 11, wherein color change produced by the map, per unit change of the input number, is greater towards the lower value end of color map input.

13. The method of claim 10, wherein the color map produces a visually pronounced difference between a color assigned a bin with zero samples and a color assigned to a bin with relatively few samples.

14. The method of claim 7, further comprising the step of:
determining a log of a value of a bin of at least one of the one dimensional histograms.

15. The method of claim 1, wherein the phase change is of an amount to achieve a desired temporal resolution.

16. The method of claim 1, wherein the step of changing the phase further comprises:
changing a phase shift value;
selecting a first clock input and a second clock input based upon a first more-significant portion of the phase shift value;
selecting a first gain for the first clock input based upon a second less-significant portion of the phase shift value; and
selecting a second gain for the second clock input based upon the second less-significant portion of the phase shift value, wherein the first gain and the second gain sum to a constant value.

17. The method of claim 1, wherein the step of obtaining a sample comprises:
producing the sample clock, from a first clock, in response to an asynchronous undersampling request.

18. The method of claim 17, further comprising:
holding a first phase of the first clock, with respect to a periodic content of the data signal received by the receiver circuit, constant at least until the sample clock is produced.

19. The method of claim 18, further comprising:
dividing a second clock to produce the first clock; and
holding a second phase of the second clock, with respect to each symbol of the data signal received by the receiver circuit, constant at least until the sample clock is produced.

20. The method of claim 18, further comprising:
synchronizing the asynchronous undersampling request to the first clock in order to produce the sample clock.

21. The method of claim 20, wherein the asynchronous undersampling request is synchronized to the first clock by at least one flip-flop.

22. The method of claim 1, wherein the undersampler has a sample capacitor and a hold capacitor.

23. The method of claim 22, wherein the hold capacitor is larger than the sample capacitor.

24. The method of claim 22, wherein the hold capacitor is large enough to hold a charge during an analog-to-digital conversion of the charge.

25. The method of claim 22, wherein the sample capacitor is small enough to permit a sufficiently high bandwidth data signal to be received by the receiver circuit and is large enough to permit a charge to be established on the hold capacitor.

26. The method of claim 1, wherein the step of obtaining a sample comprises:
tracking the data signal on a sample capacitor during a tracking period; and
charging a hold capacitor, with a charge that has a predetermined relation to a charge on the sample capacitor, during a holding period.

27. The method of claim 1, wherein the step of obtaining a sample comprises:
obtaining a first and second differential samples as discrete time analog values;
converting the first and second differential samples into a single value, wherein the single value is a discrete time analog value; and
converting the single value into a discrete time digital value.

28. A system for undersampling, comprising:
a sub-system configured to repeat, a plurality of times:
(i) obtaining a sample of a data signal received by a receiver circuit, the sample obtained at a phase relative to a sample clock, wherein an undersampler, for sampling the data signal, is part of an integrated circuit and the receiver circuit is part of the same physically contiguous integrated circuit, and
(ii) adding the sample of the data signal to a one dimensional histogram associated with the phase;
a sub-system configured to change the phase; and
a sub-system configured to resume operation of the sub-system configured to repeat.

* * * * *